(12) United States Patent
Cho

(10) Patent No.: US 9,412,805 B2
(45) Date of Patent: Aug. 9, 2016

(54) INTEGRATED CIRCUITS INCLUDING INDUCTORS

(71) Applicant: TAIWAN SEMICONDUCTOR MANUFACTURING COMPANY, LTD., Hsinchu (TW)

(72) Inventor: Hsiu-Ying Cho, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/775,822

(22) Filed: Feb. 25, 2013

(65) Prior Publication Data

US 2013/0168810 A1   Jul. 4, 2013

Related U.S. Application Data

(63) Continuation of application No. 13/032,823, filed on Feb. 23, 2011, now Pat. No. 8,405,482.

(51) Int. Cl.
| | |
|---|---|
| *H01F 5/00* | (2006.01) |
| *H01L 27/08* | (2006.01) |
| *H01L 49/02* | (2006.01) |
| *H01L 23/522* | (2006.01) |

(52) U.S. Cl.
CPC ............ *H01L 28/10* (2013.01); *H01L 23/5225* (2013.01); *H01L 23/5227* (2013.01); *H01L 2924/0002* (2013.01)

(58) Field of Classification Search
CPC ............ H01L 2924/30107; H01L 2924/3025; H01L 2225/06541; H01F 41/041; H01F 17/0006; H01F 5/003

USPC ................ 336/186, 199, 200, 223; 29/602.1; 257/531

See application file for complete search history.

(56) References Cited

U.S. PATENT DOCUMENTS

| | | | |
|---|---|---|---|
| 3,368,112 A * | 2/1968 | Hellgren ............. | H05K 1/0218 174/267 |
| 3,561,110 A | 2/1971 | Feulner et al. | |
| 4,729,510 A * | 3/1988 | Landis ..................... | H01P 9/02 174/250 |
| 5,576,680 A | 11/1996 | Ling | |

(Continued)

OTHER PUBLICATIONS

Read-Only Thin Film Memory, Jun. 1962, IBM Technical Disclosure Bulletin, vol. 5, pp. 58-59.

*Primary Examiner* — Alexander Talpalatski
*Assistant Examiner* — Joselito Baisa
(74) *Attorney, Agent, or Firm* — Hauptman Ham, LLP

(57) ABSTRACT

An integrated circuit includes a substrate having a surface and an inductor disposed over the surface of the substrate. The inductor includes a first conductive line disposed over the surface and first conductive structures disposed over and electrically coupled with the first conductive line. The inductor includes second conductive structures disposed over and electrically coupled with the first conductive structures. The inductor includes a second conductive line disposed over and electrically coupled with the second conductive structures. The inductor includes third conductive structures disposed over and electrically coupled with the first conductive line and at least one fourth conductive structure disposed over and electrically coupled with the third conductive structures. The inductor includes a third conductive line disposed over and electrically coupled with the at least one fourth conductive structure, the third conductive line extending substantially parallel to the second conductive line.

16 Claims, 20 Drawing Sheets

(56) References Cited

U.S. PATENT DOCUMENTS

| | | | | |
|---|---|---|---|---|
| 5,748,523 A | * | 5/1998 | Thomas et al. | 365/171 |
| 6,008,102 A | * | 12/1999 | Alford | H01L 23/5227 257/531 |
| 6,013,939 A | | 1/2000 | El-Sharawy et al. | |
| 6,031,445 A | * | 2/2000 | Marty | H01F 27/2804 257/E21.022 |
| 6,037,649 A | * | 3/2000 | Liou | 257/531 |
| 6,116,863 A | | 9/2000 | Ahn et al. | |
| 6,249,039 B1 | * | 6/2001 | Harvey et al. | 257/531 |
| 6,313,716 B1 | | 11/2001 | Apostolos | |
| 6,362,012 B1 | | 3/2002 | Chi et al. | |
| 6,369,684 B1 | | 4/2002 | Iida et al. | |
| 6,486,529 B2 | | 11/2002 | Chi et al. | |
| 6,800,533 B1 | | 10/2004 | Yeo et al. | |
| 6,975,199 B2 | * | 12/2005 | Long et al. | 336/200 |
| 6,992,557 B2 | | 1/2006 | Aoyagi | |
| 7,040,014 B2 | | 5/2006 | Shoji | |
| 7,081,803 B2 | * | 7/2006 | Takaya et al. | 336/200 |
| 7,109,838 B2 | * | 9/2006 | Brennan et al. | 336/200 |
| 7,158,004 B2 | | 1/2007 | Ahn et al. | |
| 7,170,384 B2 | * | 1/2007 | Kim | H01F 17/0006 336/200 |
| 7,212,095 B2 | | 5/2007 | Sato et al | |
| 7,339,452 B2 | * | 3/2008 | Lee | 336/200 |
| 7,388,462 B2 | | 6/2008 | Ahn et al. | |
| 7,446,534 B2 | * | 11/2008 | Withers | 324/322 |
| 7,564,319 B2 | * | 7/2009 | Ding et al. | 331/181 |
| 7,667,566 B2 | | 2/2010 | Hsu et al. | |
| 7,796,006 B2 | * | 9/2010 | Chen | H01F 17/0013 336/147 |
| 7,879,186 B2 | | 2/2011 | Lindley et al. | |
| 7,924,131 B2 | * | 4/2011 | Walls | 336/200 |
| 8,068,004 B1 | | 11/2011 | Chong et al. | |
| 8,081,121 B2 | | 12/2011 | Kato et al. | |
| 2003/0034867 A1 | * | 2/2003 | Berthold | H01F 17/0033 336/200 |
| 2008/0238881 A1 | * | 10/2008 | Perski | G06F 3/0416 345/173 |
| 2009/0058589 A1 | * | 3/2009 | Chen | H01F 17/0013 336/200 |
| 2013/0093045 A1 | * | 4/2013 | Cho | H01L 23/5223 257/531 |
| 2013/0119511 A1 | * | 5/2013 | Shi | H01F 27/2804 257/531 |

\* cited by examiner

INTEGRATED CIRCUITS INCLUDING INDUCTORS

RELATED APPLICATIONS

This application is a continuation of U.S. application Ser. No. 13/032,823, entitled "Integrated Circuits Including Inductors," filed on Feb. 23, 2011, which is incorporated by reference herein in its entirety.

TECHNICAL FIELD

The present disclosure relates generally to the field of semiconductor devices, and more particularly, to integrated circuits including inductors.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

As mentioned above, the trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the current trend is to use copper for a conductive material because copper has better electrical characteristics than aluminum, such as decreased resistance, higher conductivity, and a higher melting point.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
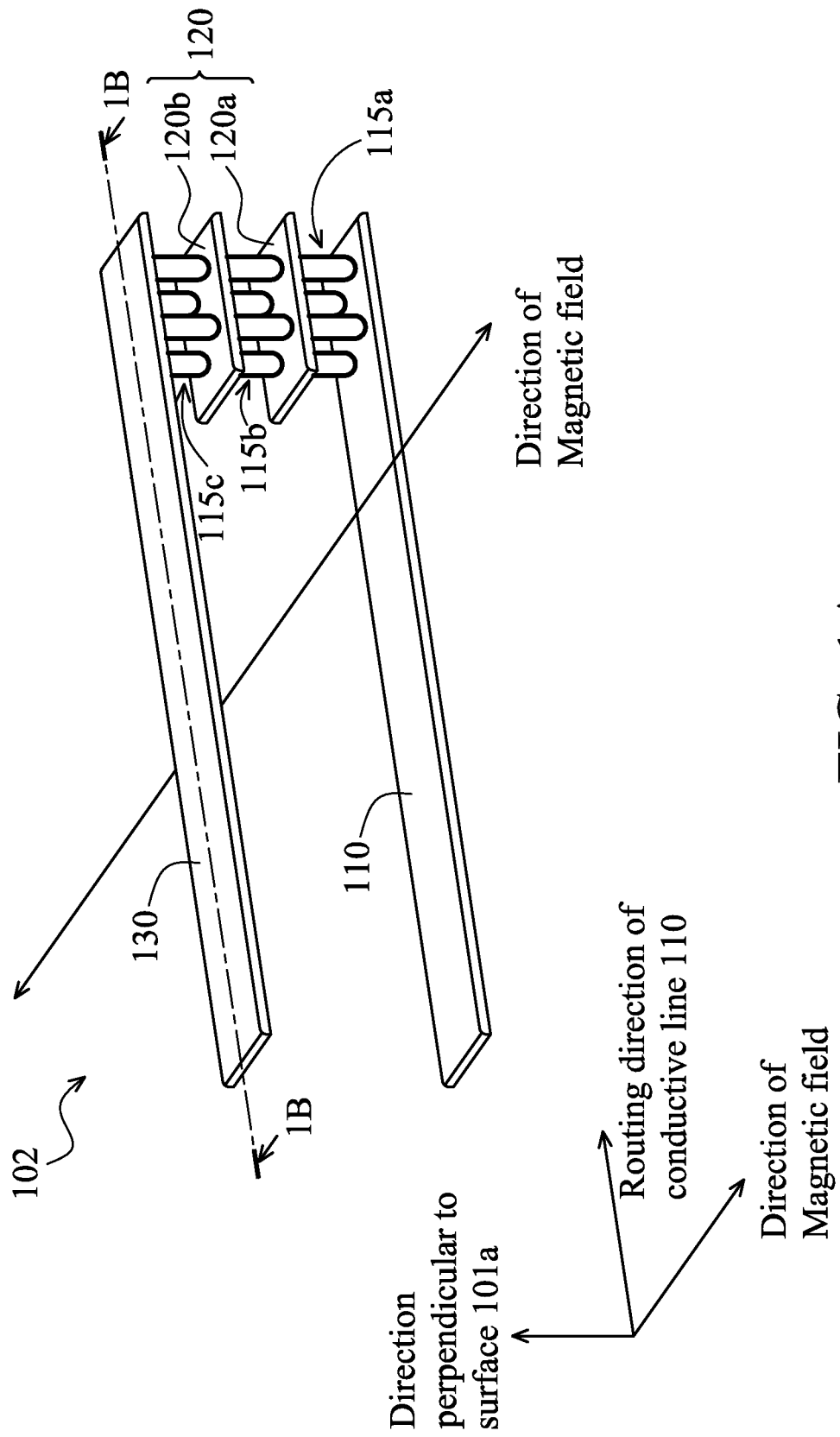
FIG. 1A is a schematic drawing illustrating a 3-dimensional (3-D) structure of a first exemplary inductor.

Inductors have been adopted in integrated circuits (ICs) for storing energy in magnetic fields that are created by currents flowing through the inductors. Usually, an inductor is routed as a coil on a single metallization layer disposed over a substrate. While the current flows through the inductor, the magnetic field induced by the current has a direction perpendicular to the surface of the substrate.

It is found that despite the scale-down of the integrated circuit, the horizontally-disposed inductor takes up a big area for inducing a desired magnetic field. The area consumption of the horizontally disposed inductor works against the scale-down trend of the integrated circuits.

It is also found that the magnetic field induced by the horizontally disposed inductor is perpendicular to the surface of the substrate. The magnetic interaction between the substrate and the inductor degrades the quality factor of the integrated circuit.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
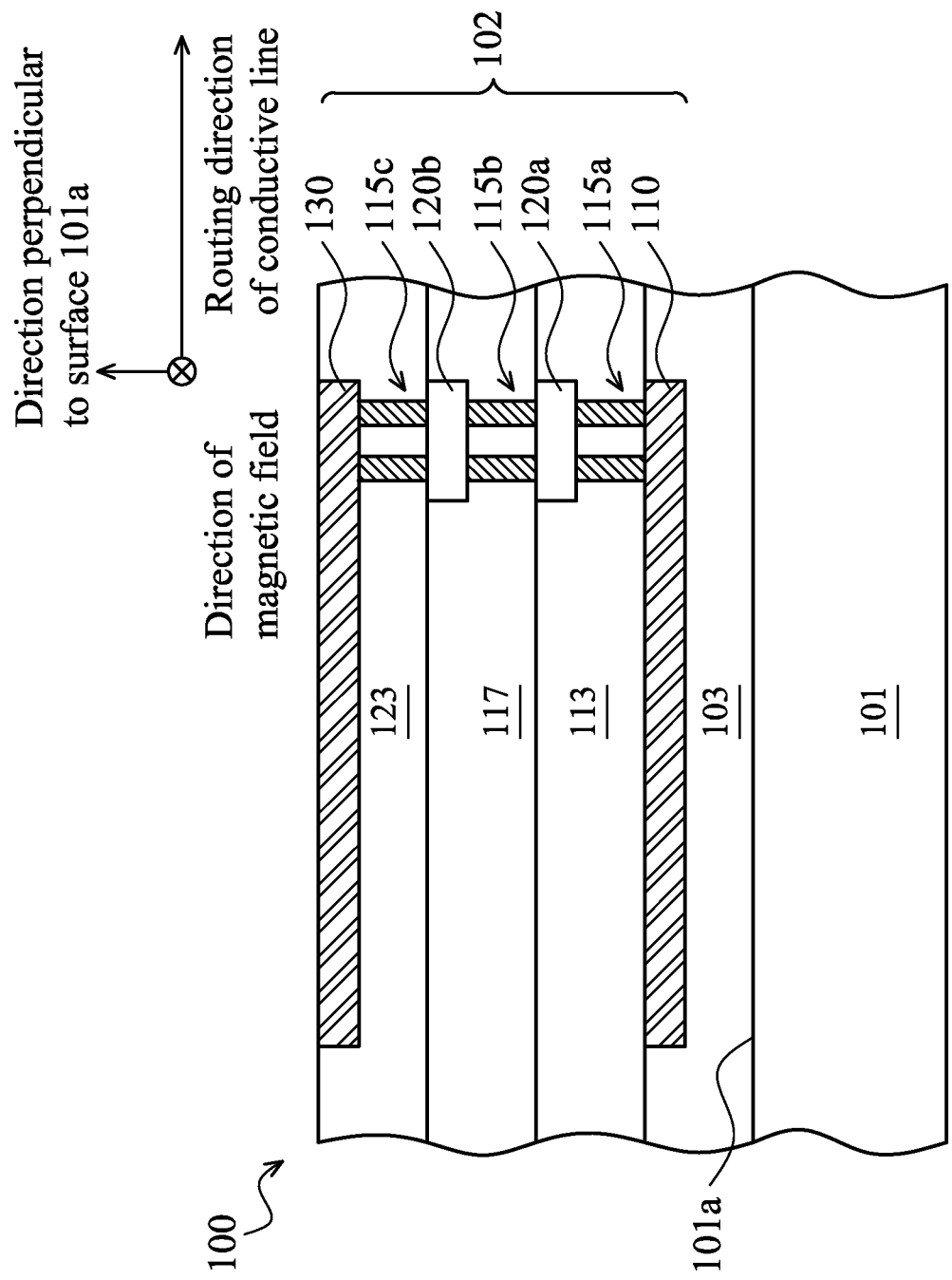
FIG. 1B is a schematic cross-sectional view of the first exemplary inductor taken along a section line 1B-1B of FIG. 1A.

FIG. 1A is a schematic drawing illustrating a 3-dimensional (3-D) structure of a first exemplary inductor. FIG. 1B is a schematic cross-sectional view of an exemplary inductor taken along a section line 1B-1B of FIG. 1A. Referring to FIGS. 1A-1B, an integrated circuit 100 can include a substrate 101 having a surface 101a. An inductor 102 can be disposed over the surface 101a of the substrate 101. The inductor 102 can be operable to generate a magnetic field through itself that is substantially parallel with the surface 101a of the substrate 101.

In some embodiments, the inductor 102 can be applied in an inductive-capacitive (LC) tank, an LC-coupled amplifier, a high power amplifier, a low noise amplifier, and/or other integrated circuits that are operable to provide inductance. In some embodiments using a LC tank, the inductor can be electrically coupled with a capacitor in a parallel fashion.

Referring to FIGS. 1A-1B, in some embodiments the inductor 102 can include a conductive line, e.g., a conductive line 110, disposed over the surface 101a of the substrate 101. The inductor 102 can include at least one conductive structure 120. The at least one conductive structure 120 can include, for example, conductive structures 120a-120b, which can be disposed over and electrically coupled with the conductive line 110. The inductor 102 can include a conductive line 130 that can be disposed over and electrically coupled with the at least one conductive structure 120. As shown in FIGS. 1A-1B, the magnetic field (not shown) induced by a current (not shown) flowing through the inductor 102 can be substantially perpendicular to the routing direction of the conductive lines 110 and 130 and substantially parallel with the surface 101a of the substrate 101.

In some embodiments, the conductive lines 110 and 130 can be electrically coupled with the conductive structures 120a-120b through conductive structures 115a-115c. The conductive structures 115a-115c can each include at least one via plug, at least one contact plug, at least one damascene structure, at least one dual damascene structure, at least one metallic region, at least one metallic line, other shapes of metallic structures, and/or any combinations thereof.

Referring to FIG. 1B, the inductor 102 can be disposed over the substrate 101. The substrate 101 can be a silicon substrate doped with a P-type dopant, such as boron (a P-type substrate). Alternatively, the substrate 101 could be another suitable semiconductor material. For example, the substrate 101 may be a silicon substrate that is doped with an N-type dopant, such as phosphorous or arsenic (an N-type substrate). The substrate 101 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 101 could include an epitaxial layer (epi layer), may be strained for performance enhancement, and may include a silicon-on-insulator (SOI) structure. In some embodiments, at least one passive device (not shown), e.g., capacitors, resistors, inductors, and/or other passive devices, and at least one active device (not shown), e.g., metal-oxide-semiconductor (MOS) transistors, bipolar junction transistors (BJTs), complementary MOS (CMOS) transistors, etc., can be disposed on and/or over the substrate 101.

In some embodiments, the inductor 102 can be embedded in a interconnect metallization structure (not labeled) that is formed over the substrate 101. The interconnect metallization structure can be configured to provide electrical interconnections among the active devices and/or passive devices formed over the substrate 101. For example, the interconnect metallization structure can include a plurality of metallization layers (not labeled). The metallization layers may each include at least one dielectric layer, e.g., dielectric layers 103, 113, 117 or 123. The dielectric layers 103, 113, 117 and 123 may each include at least one material, such as silicon oxide, silicon nitride, silicon oxynitride, silicon carbide, silicon oxycarbide, low dielectric constant (low-k) dielectric material, ultra-low-k dielectric material, other dielectric materials, or any combinations thereof.

In some embodiments, the conductive lines 110 and 130 and the conductive structures 115a-115c and 120a-120b can each be made of at least one material, such as tungsten, aluminum, copper, titanium, tantalum, nickel, cobalt, titanium nitride, tantalum nitride, nickel silicide, cobalt silicide, other proper semiconductor materials, and/or any combinations thereof. Though merely showing four metallization layers in FIG. 1B, the scope of this application is not limited thereto. In some embodiments, the interconnect metallization structure can include more or less than four metallization layers.

It is noted that the inductor 102 can be routed as a coil. Since the coil vertically stands over the substrate 101, the magnetic field induced by a current flowing through the inductor 101 can be substantially parallel with the surface 101a of the substrate 101. Since the magnetic field is substantially parallel with the surface 101a of the substrate 101, the magnetic interaction between the inductor 102 and the substrate 101 can be reduced. The quality factor of the integrated circuit 100 can be increased. It is also noted that since the inductor 102 is vertically disposed with respect to the surface 101a, the area over the surface 101a to accommodate the inductor 102 can be reduced.

Figure 2A:
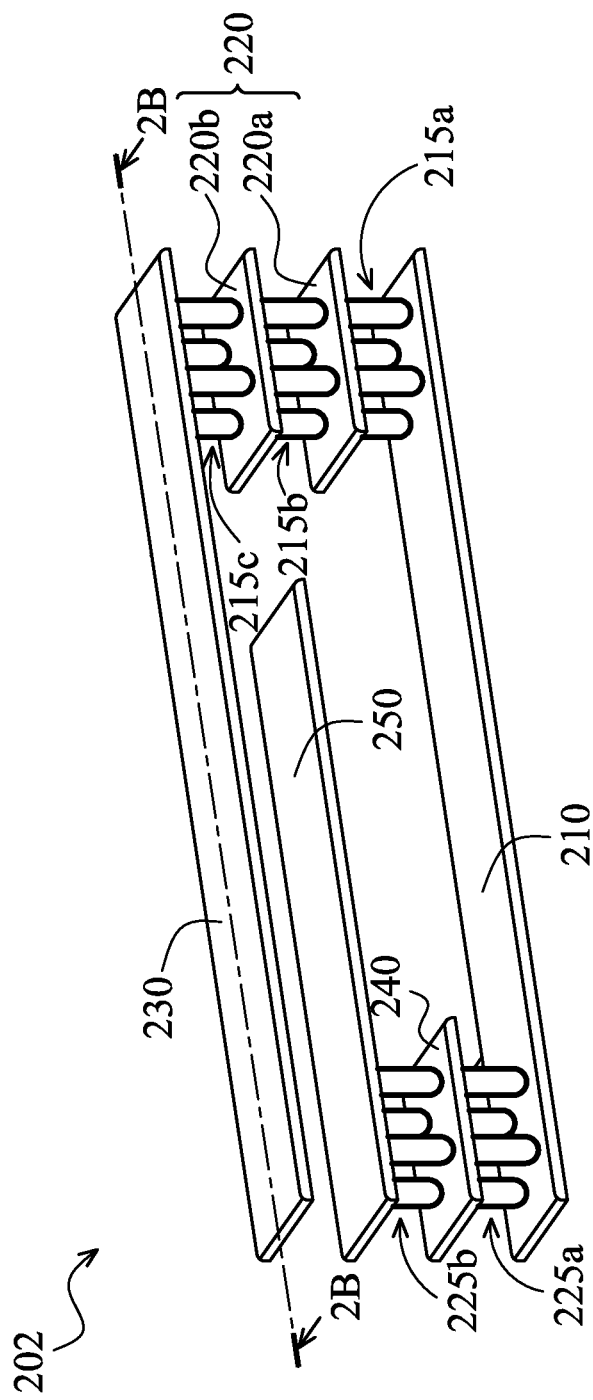
FIG. 2A is a schematic drawing illustrating a 3-D structure of a second exemplary inductor.
Figure 2B:
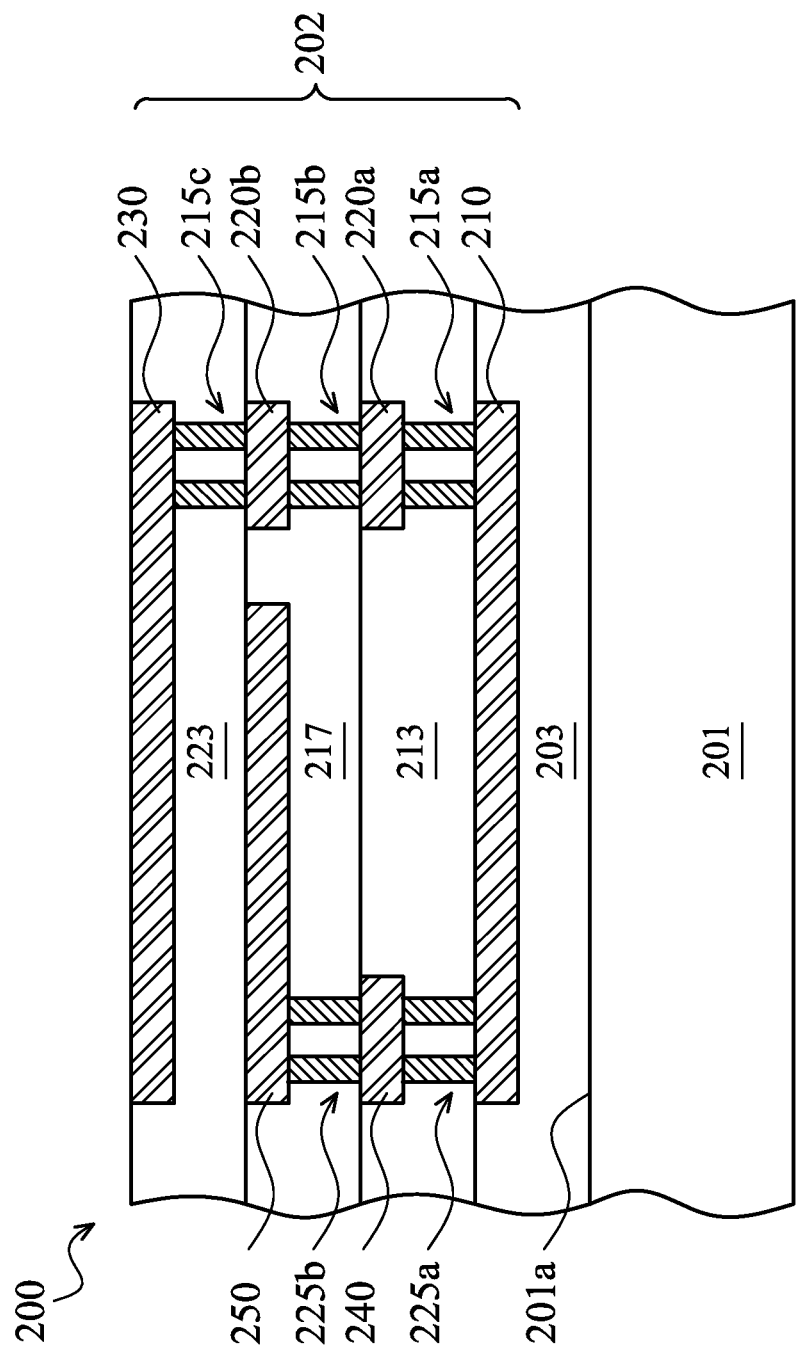
FIG. 2B is a schematic cross-sectional view of the second exemplary inductor taken along a section line 2B-2B of FIG. 2A.

FIG. 2A is a schematic drawing illustrating a 3-dimensional (3-D) structure of a second exemplary inductor. FIG. 2B is a schematic cross-sectional view of an exemplary inductor taken along a section line 2B-2B of FIG. 2A. Items of FIGS. 2A-2B that are the same or similar items in FIGS. 1A-1B are indicated by the same reference numerals, increased by 100. Referring to FIGS. 2A-2B, at least one conductive structure, e.g., a conductive structure 240 can be disposed over and electrically coupled with a conductive line 210. A conductive line 250 can be disposed over and electrically coupled with the conductive structure 240. The conductive line 250 can be made of materials that are as same as or similar to those of the conductive lines 110 and/or 130 described above in conjunction with FIGS. 1A-1B.

In some embodiments, the conductive lines 210 and 250 can be electrically coupled with the conductive structure 240 through conductive structures 225a-225b. The conductive structures 225a-225b can each include at least one via plug, at least one contact plug, at least one damascene structure, at least one dual damascene structure, at least one metallic region, at least one metallic line, other shapes of metallic structures, and/or any combinations thereof.

In some embodiments, the conductive line 250 and the conductive structure 220b can be disposed in the same metallization layer as shown in FIG. 2B. In other embodiments, the conductive line 250 and the conductive structure 220a can be disposed in the same metallization layer. In still other embodiments, the conductive line 250 can be disposed in a metallization layer that is between the metallization layers including the conductive line 230 and conductive structure 220b, between the conductive structure 220b and conductive structure 220a, or between the conductive structure 220a and conductive line 210.

It is noted that the inductor 202 described above in conjunction with FIGS. 2A-2B is merely exemplary. In some embodiments, the inductor 202 can be routed as a coil. The inductor 202 can include additional conductive structures and/or lines between the conductive lines 210 and 250, such that the inductor 202 spirals toward the center of the coil.

Figure 3A:
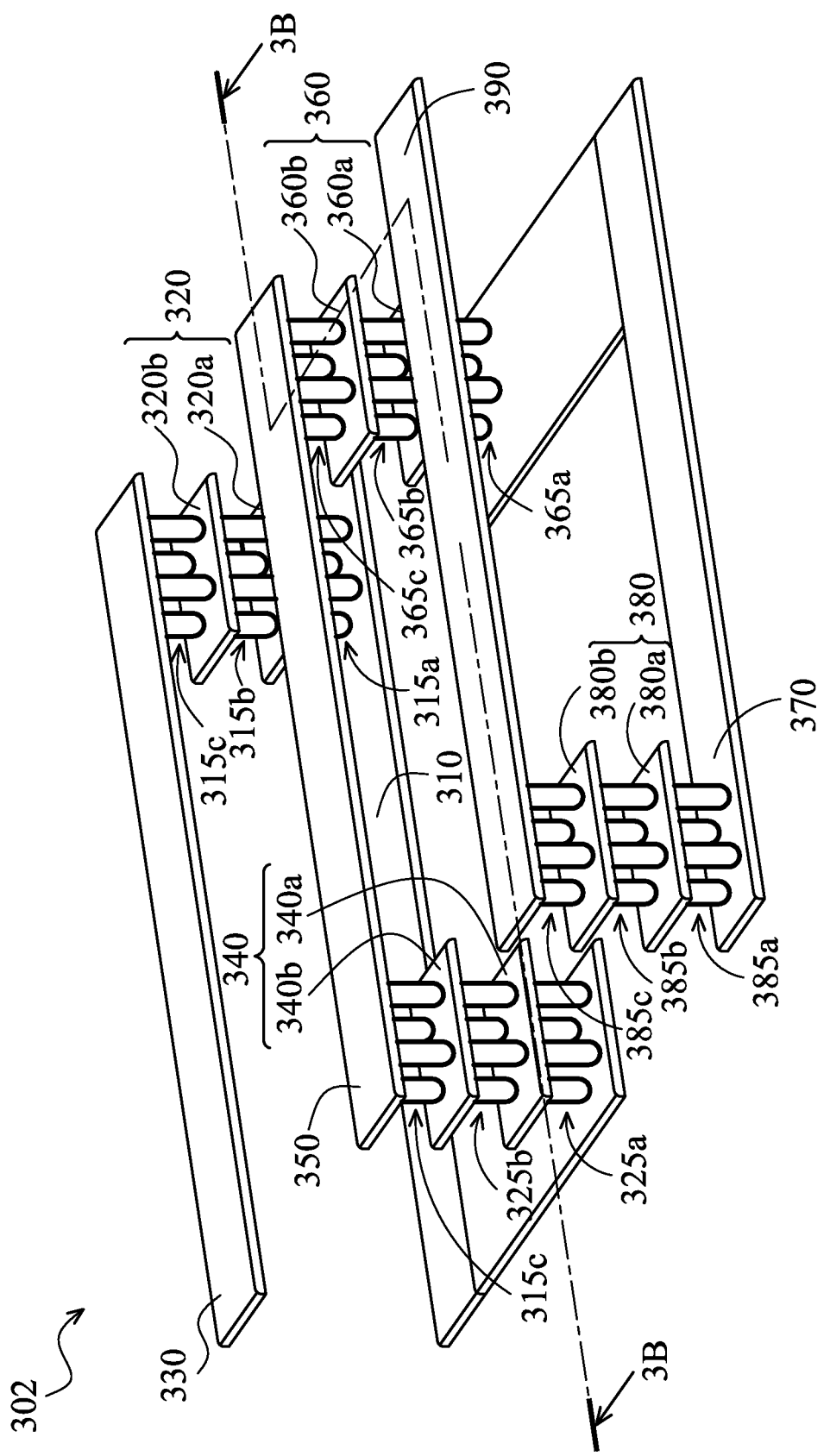
FIG. 3A is a schematic drawing illustrating a 3-D structure of a third exemplary inductor.
Figure 3B:
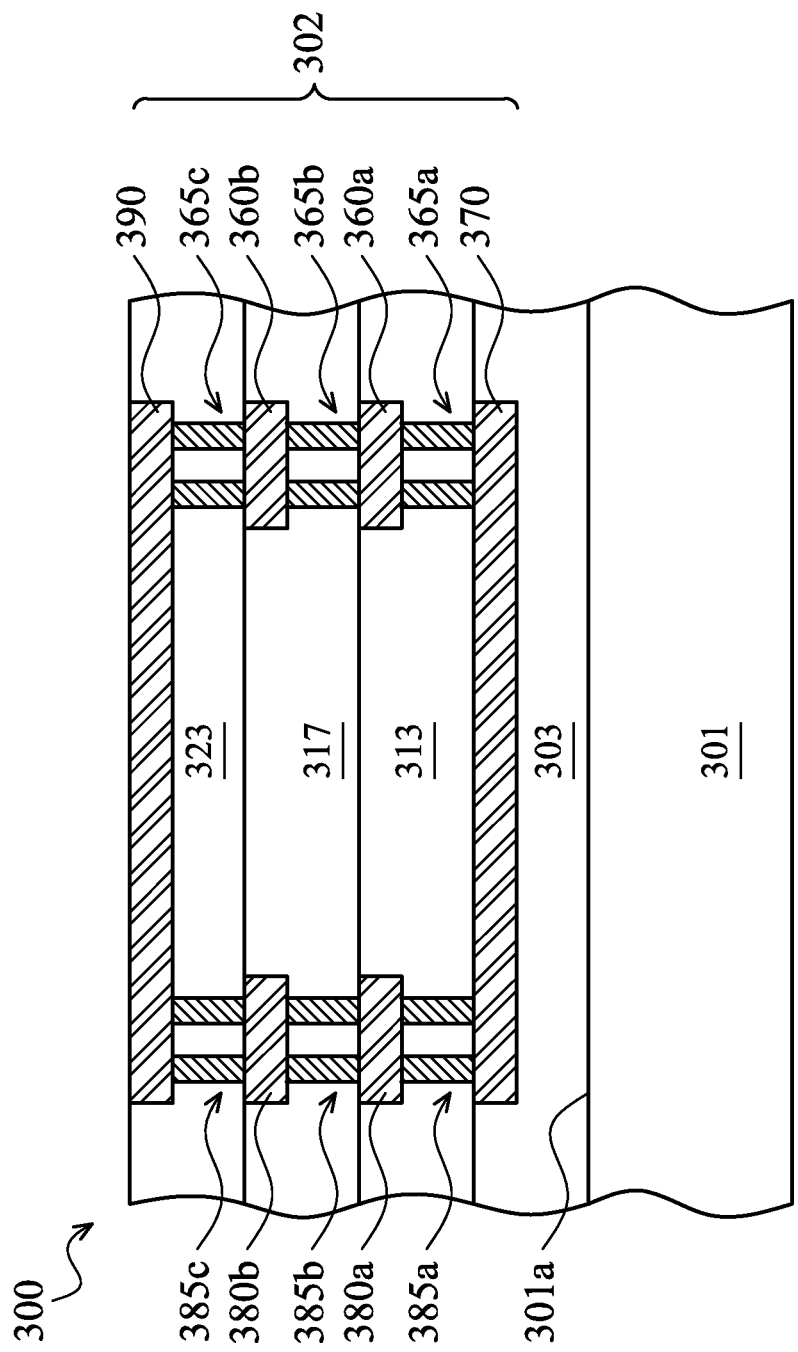
FIG. 3B is a schematic cross-sectional view of the third exemplary inductor taken along a section line 3B-3B of FIG. 3A.

FIG. 3A is a schematic drawing illustrating a 3-dimensional (3-D) structure of a third exemplary inductor. FIG. 3B is a schematic cross-sectional view of an exemplary inductor taken along a section line 3B-3B of FIG. 3A. Items of FIGS. 3A-3B that are the same or similar items in FIGS. 2A-2B are indicated by the same reference numerals, increased by 100. Referring to FIGS. 3A-3B, in some embodiments a conductive line 310 can have an L shape. At least one conductive structure 340 can include, for example, conductive structures 340a-340b. The conductive structures 340a-340b can be disposed over and electrically coupled with the conductive line 310. A conductive line 350 can be disposed over and electrically coupled with the conductive structures 340a-340b.

Referring to FIG. 3A, at least one conductive structure 360 can include, for example, conductive structures 360a-360b. The conductive structures 360a-360b can be disposed below and electrically coupled with the conductive line 350. A conductive line 370 can be disposed below and electrically coupled with the conductive structures 360a-360b. The conductive line 370 can have an L shape.

In some embodiments, the conductive lines 350 and 370 can be electrically coupled with the conductive structures 360a-360b through conductive structures 365a-365c. The conductive structures 365a-365c can each include at least one via plug, at least one contact plug, at least one damascene structure, at least one dual damascene structure, at least one metallic region, at least one metallic line, other shapes of metallic structures, and/or any combinations thereof.

Referring again to FIG. 3A, at least one conductive structure 380 can include, for example, conductive structures 380a-380b. The conductive structures 380a-380b can be disposed over and electrically coupled with the conductive line 370. A conductive line 390 can be disposed over and electrically coupled with the conductive structures 380a-380b.

In some embodiments, the conductive lines 370 and 390 can be electrically coupled with the conductive structures 380a-380b through conductive structures 385a-385c. The conductive structures 385a-385c can each include at least one via plug, at least one contact plug, at least one damascene structure, at least one dual damascene structure, at least one metallic region, at least one metallic line, other shapes of metallic structures, and/or any combinations thereof. In some embodiments, the conductive lines 370 and 390 can be made of materials that are as same as or similar to those of the conductive lines 110 and/or 130 described above in conjunction with FIGS. 1A-1B.

In some embodiments, the conductive lines 330, 350 and 390 can be disposed in the same metallization layer as shown in FIG. 3A. In other embodiments, at least two of the conductive lines 330, 350 and 390 can be disposed in different metallization layers. In still other embodiments, the conductive lines 310 and 370 can be disposed in the same metallization layer as shown in FIG. 3A. In yet still other embodiments, the conductive lines 310 and 370 can be disposed in different metallization layers.

It is noted that the inductor 302 described above in conjunction with FIGS. 3A-3B is merely exemplary. In some embodiments, the inductor 302 can include additional conductive structures and/or lines, such that more coils can be vertically routed over the substrate 101.

In some embodiments, an integrated circuit can include a shielding structure. The shielding structure can be disposed over the substrate. The shielding structure can include at least one shielding portion that is disposed between the substrate and the inductor. The shielding structure can be configured to at least partially shield the magnetic field generated from the inductor from disturbing the operating speed of the integrated circuit. By such, a desired quality factor can be achieved.

Figure 4A:
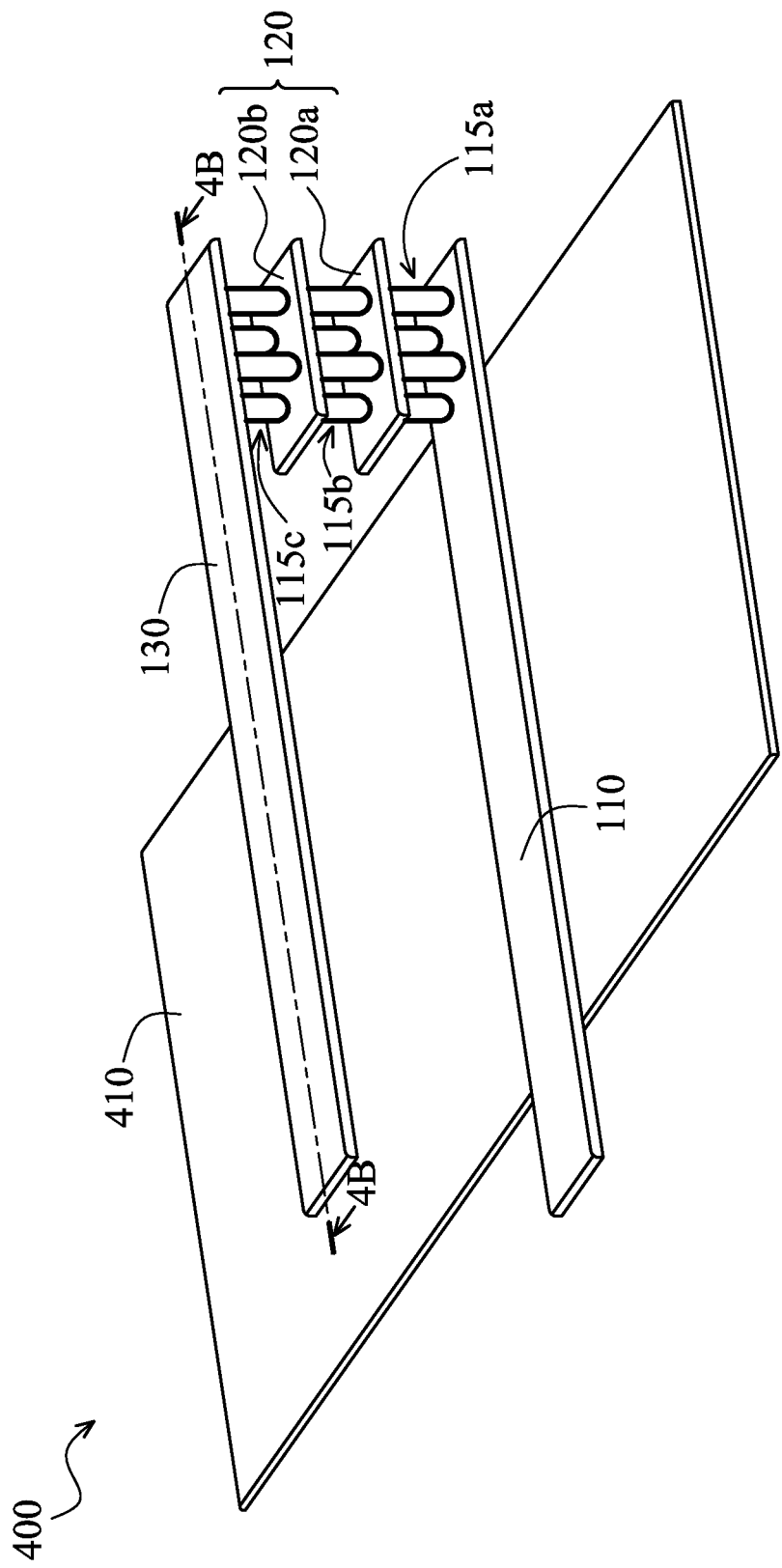
FIG. 4A is a schematic drawing illustrating a 3-D structure of the first exemplary inductor and a first exemplary shielding structure.
Figure 4B:
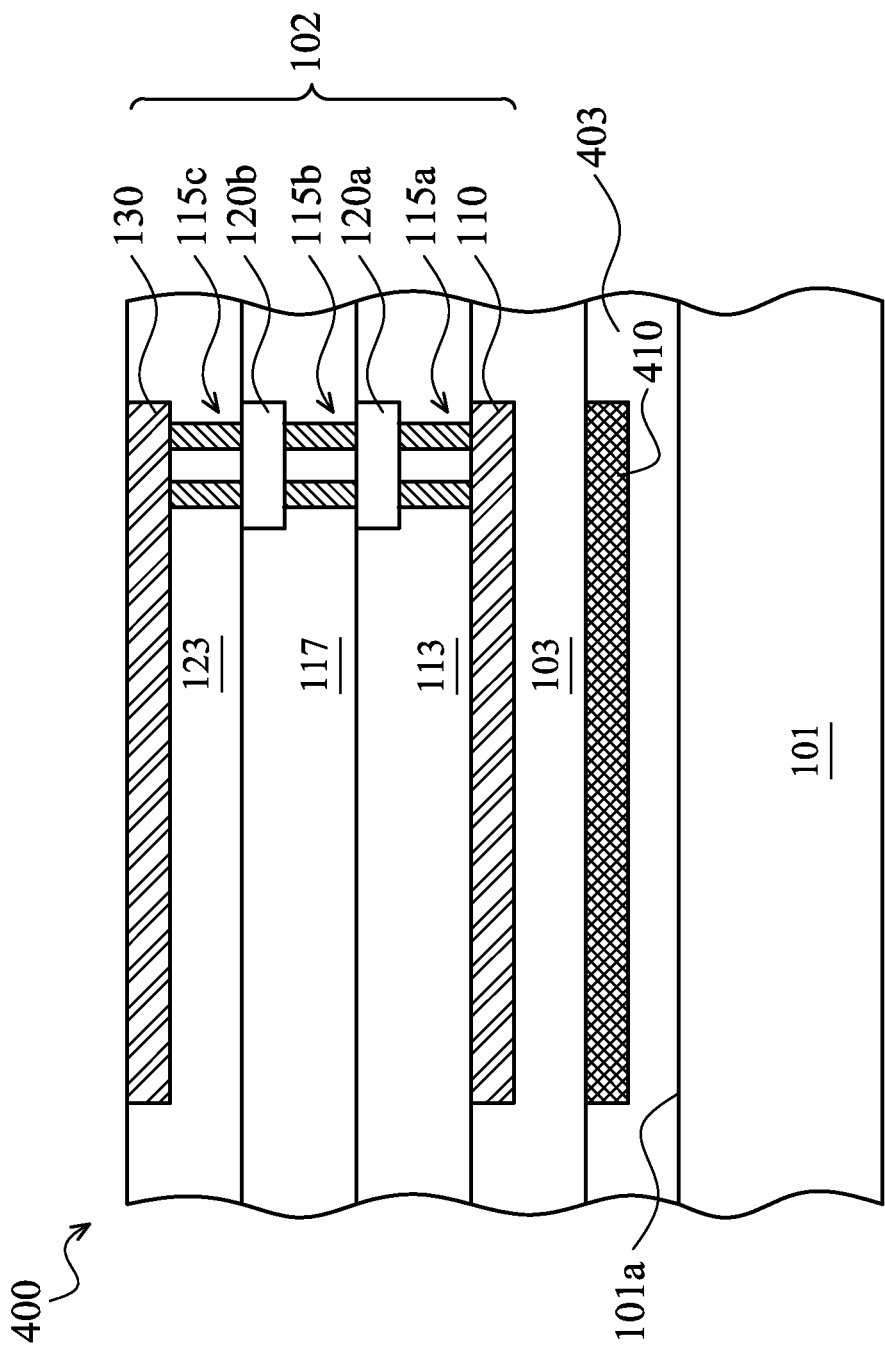
FIG. 4B is a schematic cross-sectional view of the first exemplary inductor and the first exemplary shielding structure taken along a section line 4B-4B of FIG. 4A.

For example, an integrated circuit 400 can include a shielding structure 410 that is disposed between the inductor 102 and the substrate 101 as shown in FIGS. 4A-4B. In some embodiments, the shielding structure 410 can be a metallic plate as shown in FIG. 4A. During the operation of the integrated circuit 400, the shielding structure 410 can be grounded or floating. In some embodiments, the shielding structure 410 can be made of at least one material, such as tungsten, aluminum, copper, titanium, tantalum, nickel, cobalt, titanium nitride, tantalum nitride, nickel silicide, cobalt silicide, other proper conductive materials, and/or any combinations thereof.

In some embodiments, the shielding structure 410 can be disposed in a metallization layer that is different from the metallization layer in which the conductive line 110 is disposed. For example, the shielding structure 410 can be disposed between the dielectric layers 103 and 403. In some embodiments, the dielectric layer 403 can include at least one material, such as silicon oxide, silicon nitride, silicon oxynitride, low dielectric constant (low-k) dielectric material, ultra-low-k dielectric material, another dielectric material, or any combinations thereof.

It is noted that the shielding structure 410 shown in FIGS. 4A-4B is merely exemplary. The scope of this application is not limited thereto. In some embodiments, the shielding structure 410 can include at least one round metallic plate, at least one square metallic plate, at least one rectangular metallic plate, at least one oval metallic plate, at least one polygonal metallic plate, a metallic ring, multiple metallic rings, at least one metallic ring around at least one metallic plate, a single metallic line routed parallel with or orthogonal to the conductive line 110, or any other shape of metallic shielding structure.

Figure 5A:
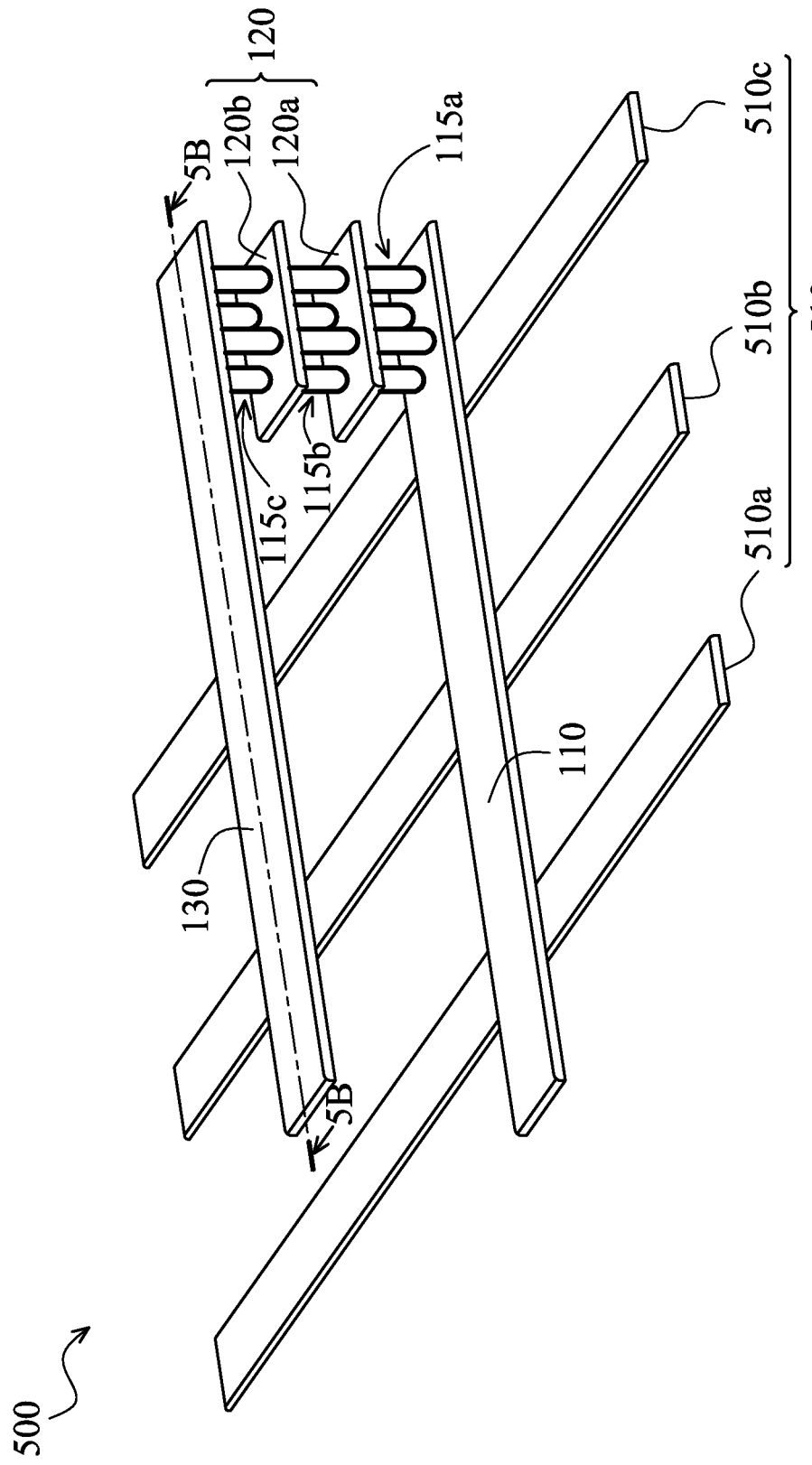
FIG. 5A is a schematic drawing illustrating a 3-D structure of the first exemplary inductor and a second exemplary shielding structure.
Figure 5B:
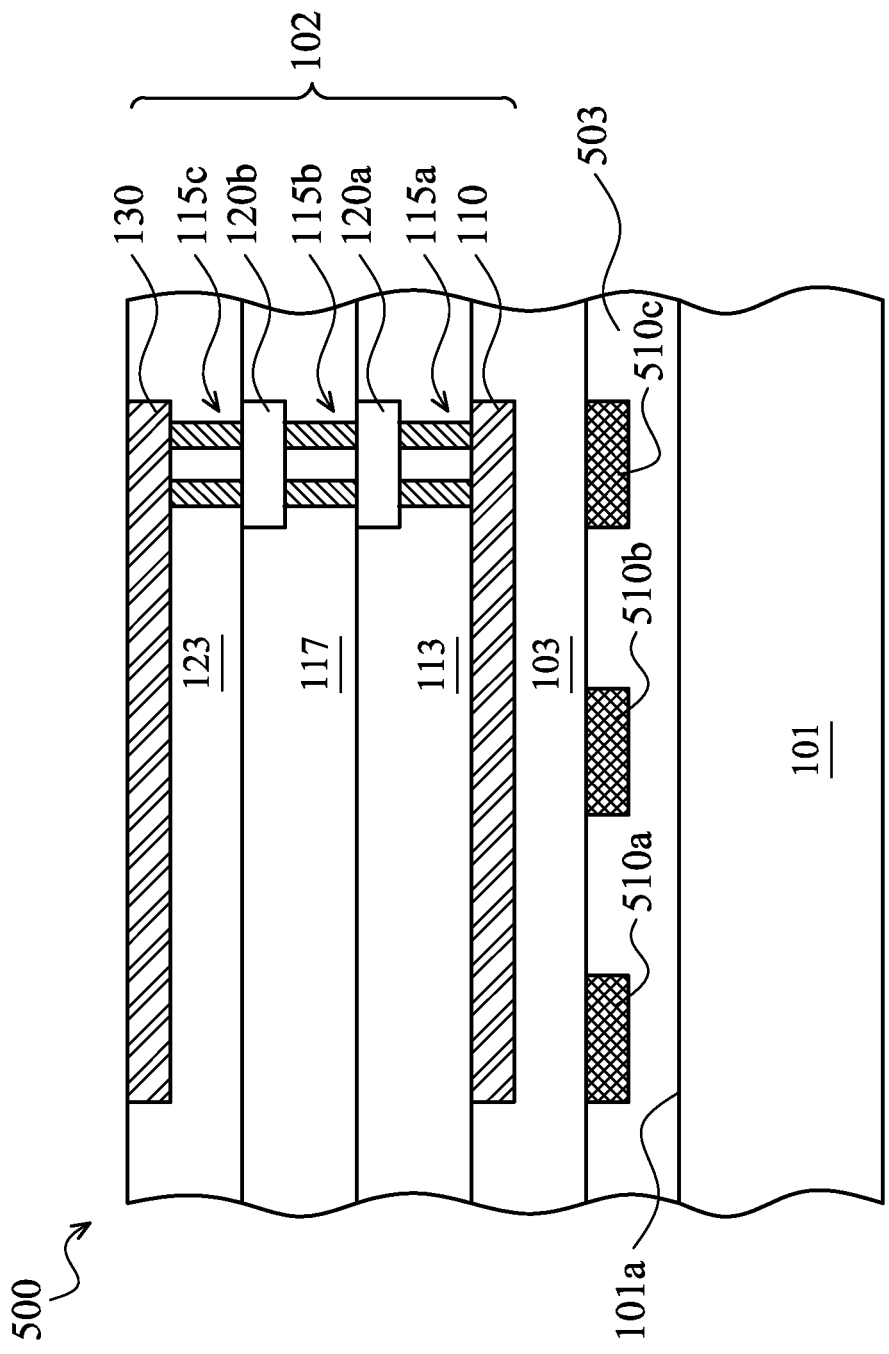
FIG. 5B is a schematic cross-sectional view of the first exemplary inductor and the second exemplary shielding structure taken along a section line 5B-5B of FIG. 5A.

In some embodiments, an integrated circuit 500 can include a shielding structure 510 that is disposed between the inductor 102 and the substrate 101 as shown in FIGS. 5A-5B. In some embodiments, the shielding structure 510 can include a plurality of metallic wires, e.g., metallic wires 510a-510c. The metallic wires 510a-510c can be disposed in a parallel fashion between the substrate 101 and the conductive line 110. The metallic wires 510a-510c can be routed in a direction that is substantially perpendicular to the routing direction of the conductive line 110.

In some embodiments, the metallic wires 510a-510c can be disposed between the dielectric layers 203 and 503. The dielectric layer 503 can include at least one material, such as silicon oxide, silicon nitride, silicon oxynitride, low dielectric constant (low-k) dielectric material, ultra-low-k dielectric material, another dielectric material, or any combinations thereof. In other embodiments, the metallic wires 510a-510c can be electrically coupled to each other. During the operation of the integrated circuit 500, the metallic wires 510a-510c can be grounded, floating, or electrically coupled with a common voltage.

Figure 6A:
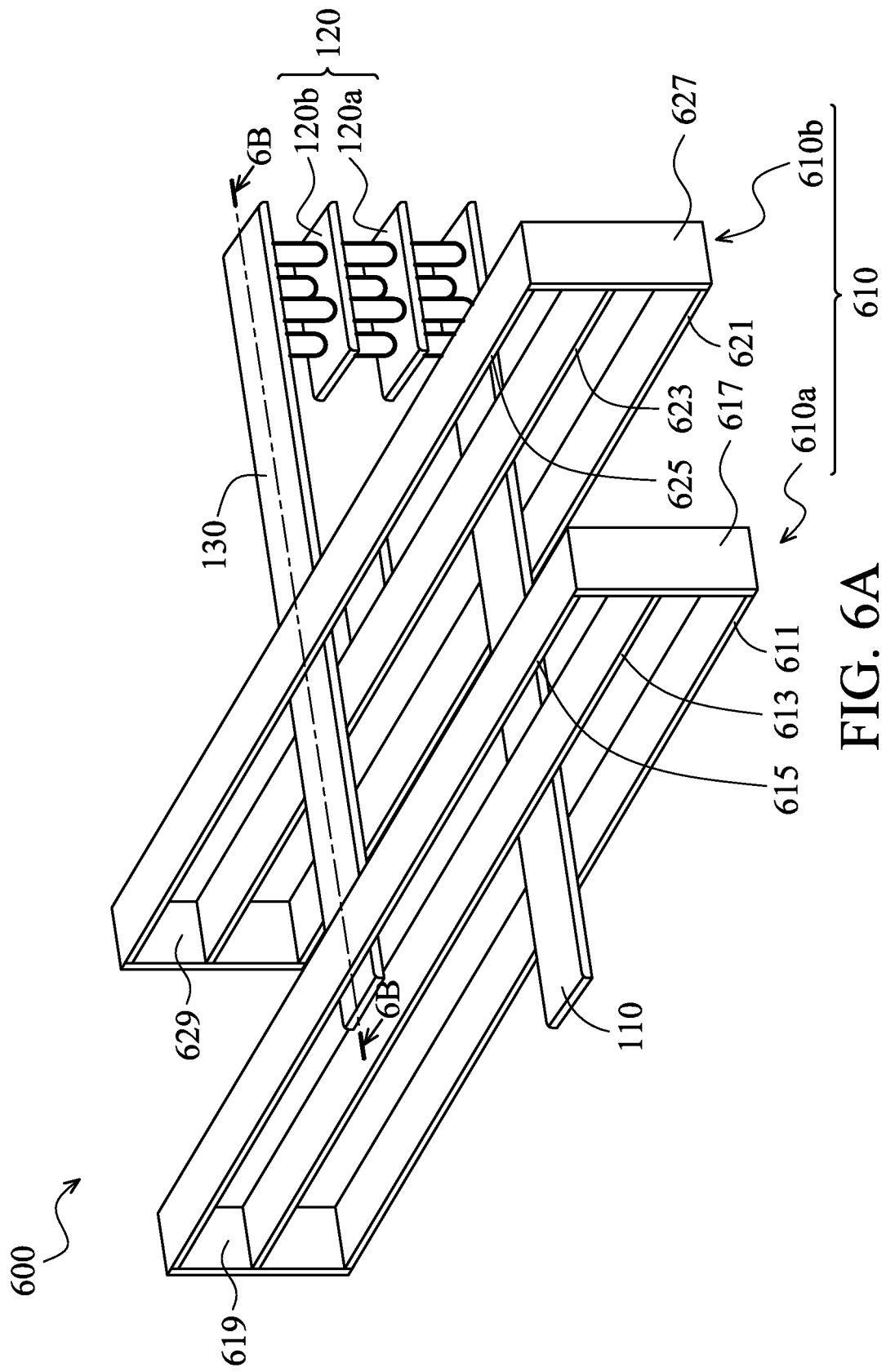
FIG. 6A is a schematic drawing illustrating a 3-D structure of the first exemplary inductor and a third exemplary shielding structure.
Figure 6B:
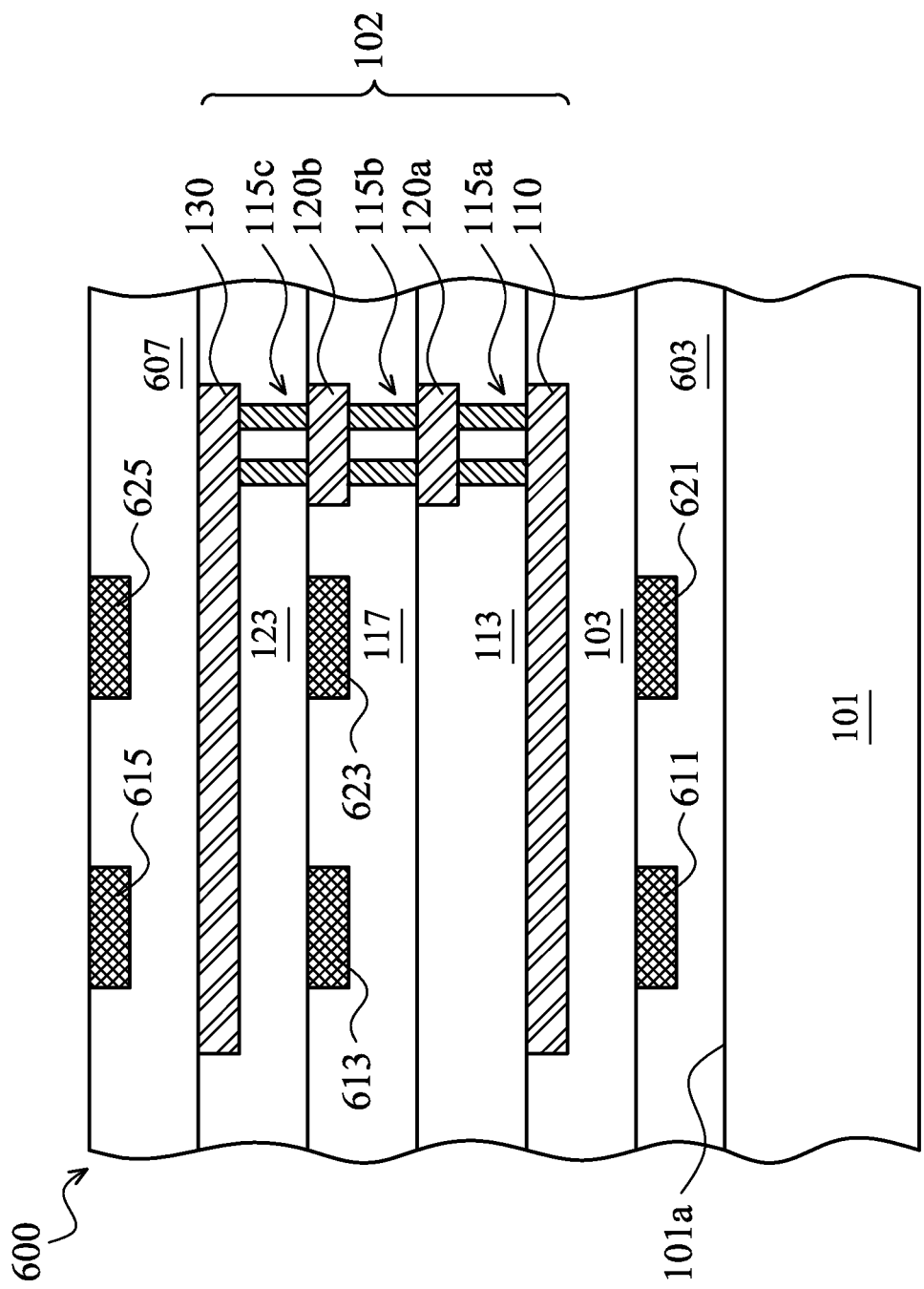
FIG. 6B is a schematic cross-sectional view of the first exemplary inductor and the third exemplary shielding structure taken along a section line 6B-6B of FIG. 6A.

FIG. 6A is a schematic drawing illustrating a 3-dimensional (3-D) structure of an exemplary inductor and an exemplary shielding structure. FIG. 6B is a schematic cross-sectional view of an exemplary inductor and an exemplary shielding structure taken along a section line 6B-6B of FIG. 6A. In FIGS. 6A-6B, the shielding structure 610 can include shielding parts 610a-610b. During the operation of the integrated circuit 600, the shielding parts 610a-610b can be grounded, floating, or electrically coupled with a common voltage.

In some embodiments, the shielding part 610a can include shielding portions 611, 613, 615, 617 and 619. The shielding part 610b can include shielding portions 621, 623, 625, 627 and 629. In other embodiments, the shielding portions 613 and 623 can be disposed between the conductive lines 110 and 130. Though merely showing two shielding parts 610a-610b in FIGS. 6A-6B, the scope of this application is not limited thereto. In some embodiments, the shielding structure 610 can include a single or more than two shielding parts. In other embodiments, the shielding parts 610a-610b can include additional shielding portions (not shown) that can be disposed between the conductive lines 110 and 130.

Referring to FIG. 6B, in some embodiments the shielding portions 611 and 621 can be disposed in a metallization layer that is below the metallization layer in which the conductive line 110 is disposed. For example, the shielding portions 611 and 621 can be disposed between the dielectric layers 103 and 603. In some embodiments, the dielectric layer 603 can include at least one material, such as silicon oxide, silicon nitride, silicon oxynitride, low dielectric constant (low-k) dielectric material, ultra-low-k dielectric material, another dielectric material, or any combinations thereof.

In some embodiments, the shielding portions 613 and 623 can be disposed between conductive lines 110 and 130. In other embodiments, the shielding portions 613 and 623 and the conductive structure 120b can be disposed in the same metallization layer as shown in FIG. 6B. In still other embodiments, the shielding portions 613 and 623 and the conductive structure 120a can be disposed in the same metallization layer. In yet still other embodiments, at least two of the shielding portions 613 and 623 and the conductive structure 120b can be disposed in different metallization layers. In some embodiments, at least one of the shielding portions 613 and 623 can be disposed in a metallization layer that is between the metallization layers in which the conductive line 130 and the conductive structure 120b, the conductive structure 120b and the conductive structure 120a or the conductive structure 120a and the conductive line 110 are disposed.

Referring again to FIG. 6B, in some embodiments the shielding portions 615 and 625 can be disposed in a metallization layer that is over the metallization layer in which the conductive line 130 is disposed. For example, the shielding portions 615 and 625 can be disposed in the metallization layer including a dielectric layer 607. In some embodiments, the dielectric layer 607 can include at least one material, such as silicon oxide, silicon nitride, silicon oxynitride, low dielectric constant (low-k) dielectric material, ultra-low-k dielectric material, another dielectric material, or any combinations thereof.

It is noted that the shielding structure 610 shown in FIGS. 6A-6B is merely exemplary. In some embodiments, at least one of the shielding portions 611, 613, 615, 617 and 619 can continuously extend and be electrically coupled with the shielding portions 621, 623, 625, 627 and 629, respectively.

Figure 7A:
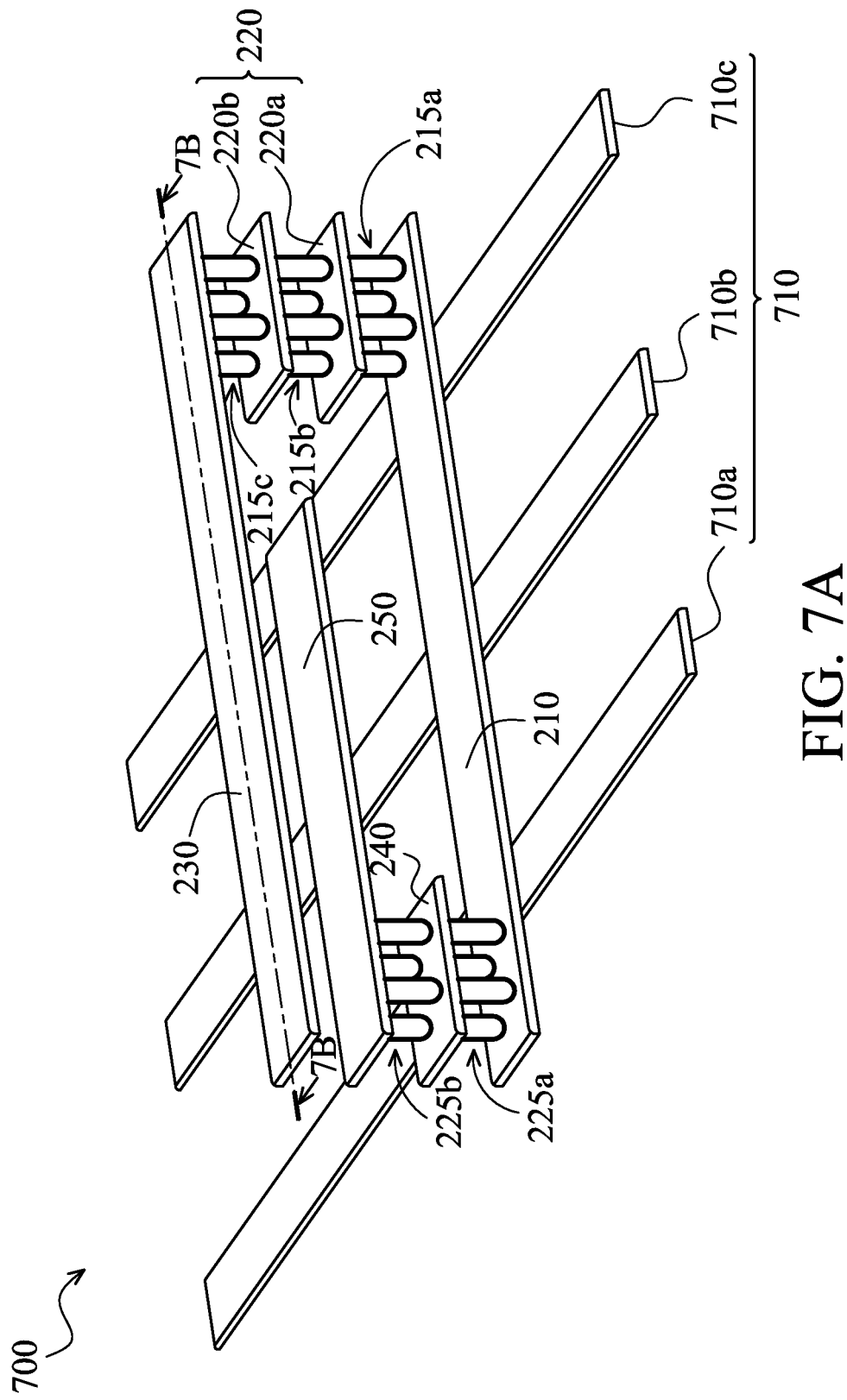
FIG. 7A is a schematic drawing illustrating a 3-D structure of the second exemplary inductor and a fourth exemplary shielding structure.
Figure 7B:
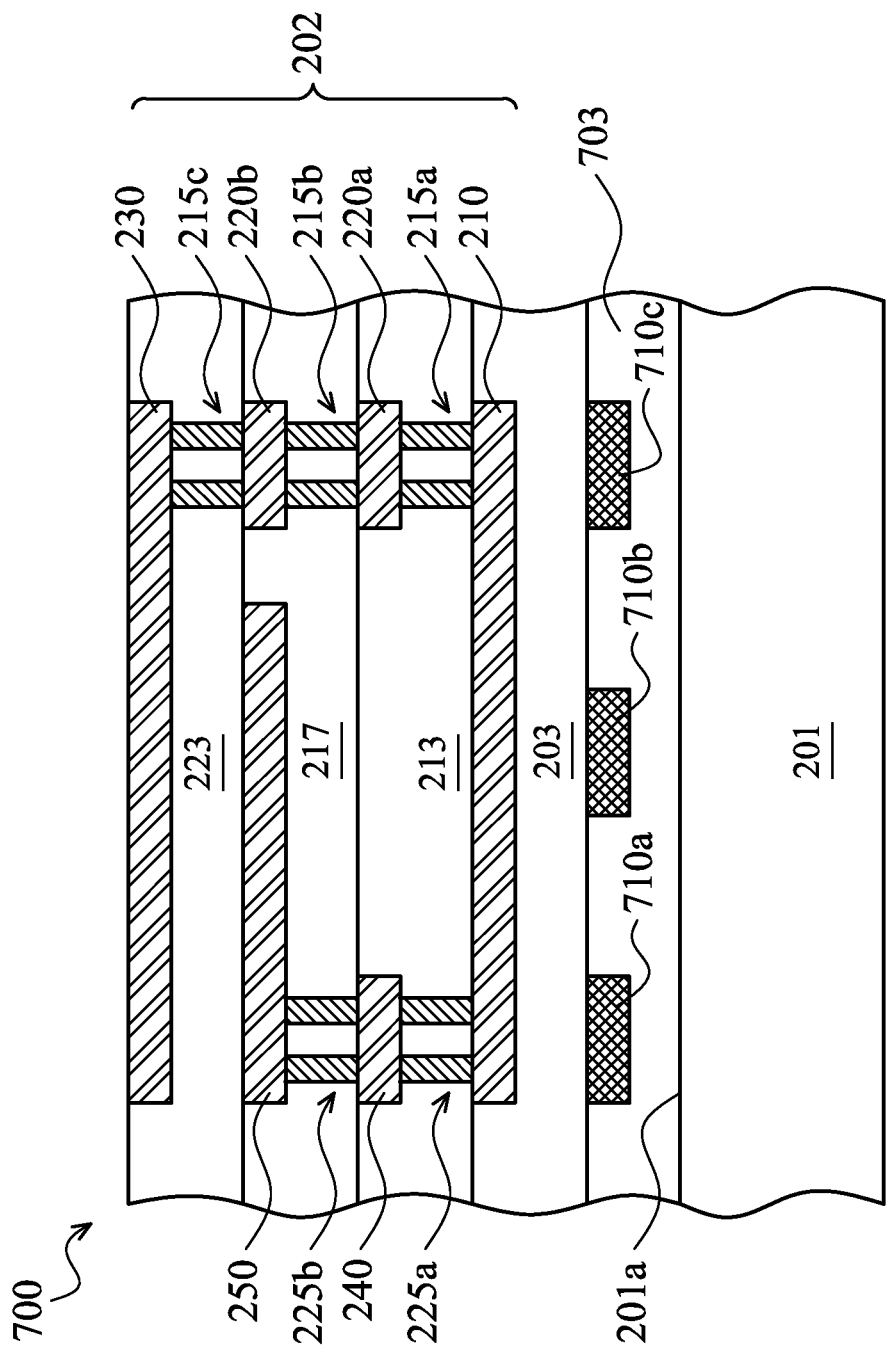
FIG. 7B is a schematic cross-sectional view of the second exemplary inductor and the fourth exemplary shielding structure taken along a section line 7B-7B of FIG. 7A.

It is also noted that the shielding structures 410, 510 and 610 described above in conjunction with FIGS. 4A-4B, 5A-5B and 6A-6B, respectively, can be applied to the inductors 202 and 302 described above in conjunction with FIGS. 2A-2B and 3A-3B. For example, an integrated circuit 700 can include a shielding structure 710 that is disposed between the inductor 202 and the substrate 201 as shown in FIGS. 7A-7B. In some embodiments, the shielding structure 710 can include a plurality of metallic wires, e.g., metallic wires 710a-710c. The metallic wires 710a-710c can be disposed in a parallel fashion between the substrate 201 and the conductive line 210. The metallic wires 710a-710c can be routed in a direction that is substantially perpendicular to the routing direction of the conductive line 210.

In some embodiments, the metallic wires 710a-710c can be disposed between the dielectric layers 203 and 703. In other embodiments, the metallic wires can be disposed in the same or different metallization layers. The dielectric layer 703 can include at least one material, such as silicon oxide, silicon nitride, silicon oxynitride, low dielectric constant (low-k) dielectric material, ultra-low-k dielectric material, another dielectric material, or any combinations thereof. In some embodiments, the metallic wires 710a-710c can be electrically coupled to each other. During the operation of the integrated circuit 700, the metallic wires 710a-710c can be grounded, floating, or electrically coupled with a common voltage.

Figure 8A:
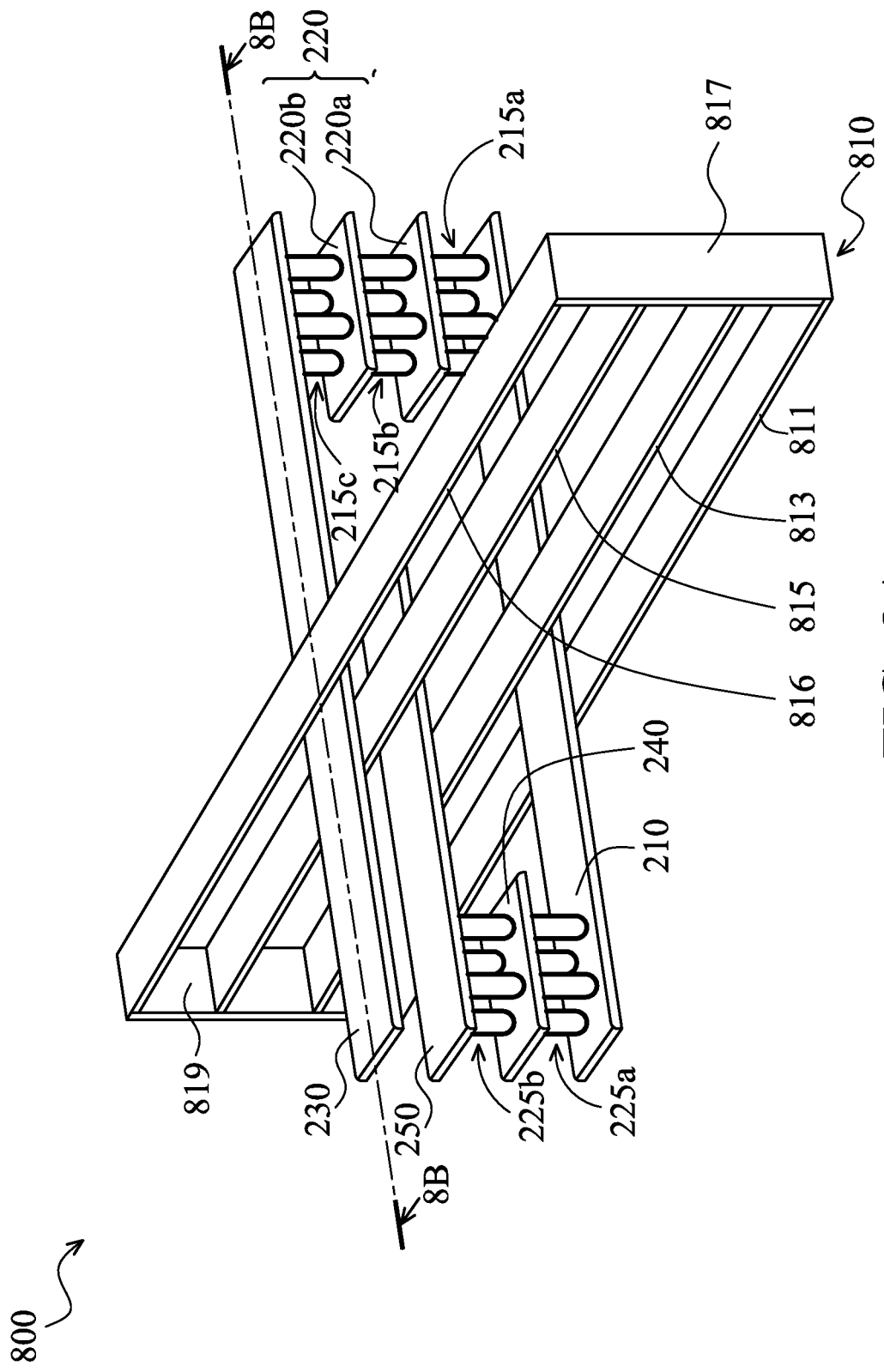
FIG. 8A is a schematic drawing illustrating a 3-D structure of the second exemplary inductor and a fifth exemplary shielding structure.
Figure 8B:
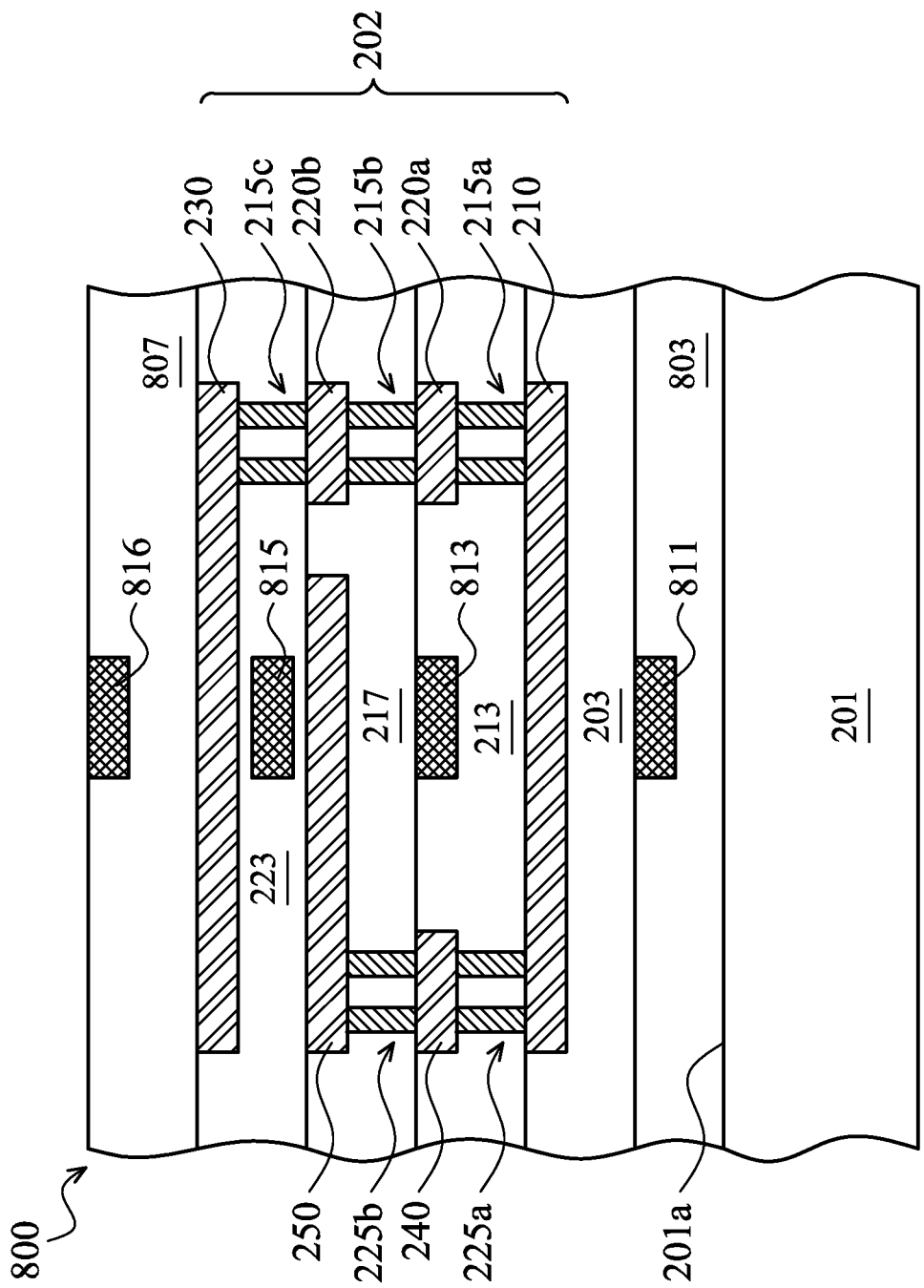
FIG. 8B is a schematic cross-sectional view of the second exemplary inductor and the sixth exemplary shielding structure taken along a section line 8B-8B of FIG. 8A.

FIG. 8A is a schematic drawing illustrating a 3-dimensional (3-D) structure of an exemplary inductor and an exemplary shielding structure. FIG. 8B is a schematic cross-sectional view of an exemplary inductor and an exemplary shielding structure taken along a section line 8B-8B of FIG. 8A. In FIGS. 8A-8B, an integrated circuit 800 can include a shielding structure 810. The shielding structure 810 can include shielding portions 811, 813, 815, 816, 817 and 819. During the operation of the integrated circuit 800, the shielding portions 811, 813, 815, 816, 817 and 819 can be grounded, floating, or electrically coupled with a common voltage.

It is noted that though merely showing a single shielding part in FIGS. 8A-8B, the scope of this application is not limited thereto. In some embodiments, the shielding structure 810 can include two or more shielding parts. In other embodiments, the shielding parts can be electrically coupled to each other. In still other embodiments, the shielding structure 810 can include additional shielding portions (not shown) that can be disposed between the conductive lines 210 and 230.

Referring to FIG. 8B, in some embodiments the shielding portion 811 can be disposed in a metallization layer that is below the metallization layer in which the conductive line 210 is disposed. For example, the shielding portion 811 can be disposed between the dielectric layers 203 and 803. In some embodiments, the dielectric layer 803 can include at least one material, such as silicon oxide, silicon nitride, silicon oxynitride, low dielectric constant (low-k) dielectric material, ultra-low-k dielectric material, another dielectric material, or any combinations thereof.

In some embodiments, the shielding portion 813 can be disposed between the conductive lines 210 and 250. In other embodiments, the shielding portion 813 and the conductive structure 220a can be disposed in the same metallization layer as shown in FIG. 8B. In other embodiments, the shielding portion 813 can be disposed in a metallization layer between the metallization layers in which the conductive line 250 and the conductive structure 220a or the conductive structure 220a and the conductive line 210 are disposed in. In still other embodiments, the shielding portion 815 can be disposed between the conductive lines 230 and 250.

Referring again to FIG. 8B, in some embodiments the shielding portion 816 can be disposed in a metallization layer that is over the metallization layer in which the conductive line 230 is disposed. For example, the shielding portion 816 can be disposed in a dielectric layer 807. In some embodiments, the dielectric layer 807 can include at least one material, such as silicon oxide, silicon nitride, silicon oxynitride, low dielectric constant (low-k) dielectric material, ultra-low-k dielectric material, another dielectric material, or any combinations thereof.

Figure 9A:
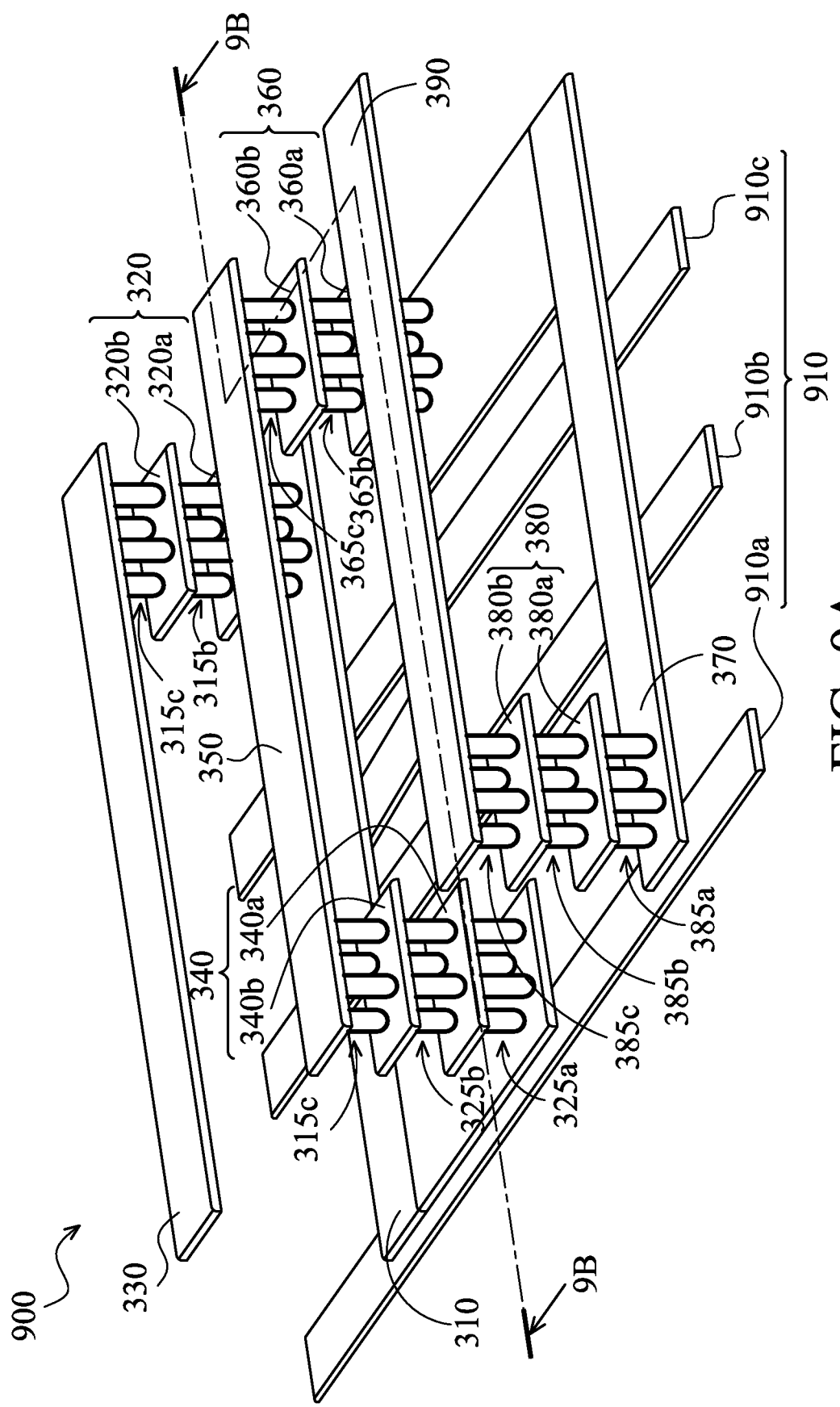
FIG. 9A is a schematic drawing illustrating a 3-D structure of a third exemplary inductor and a sixth exemplary shielding structure.
Figure 9B:
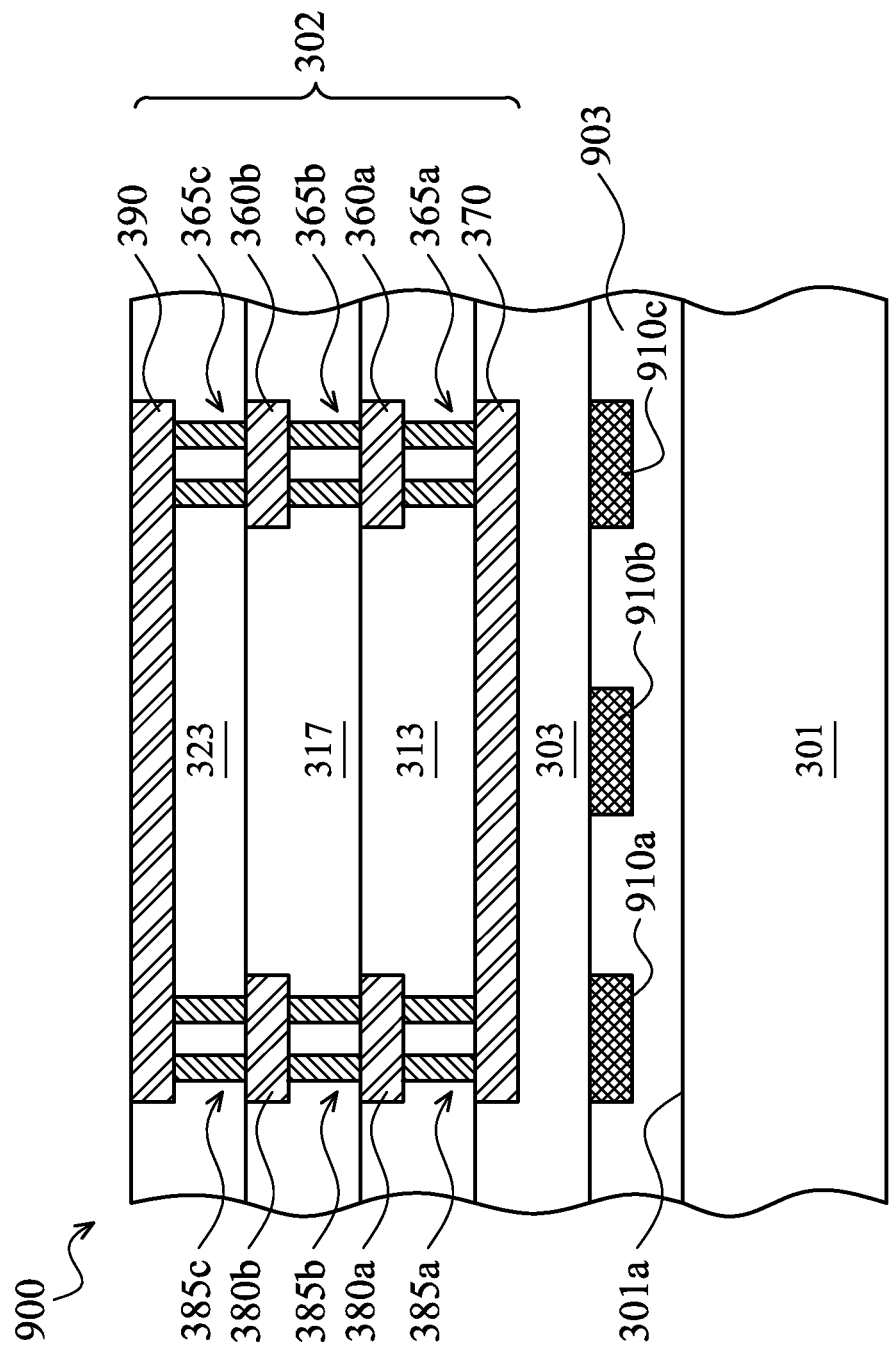
FIG. 9B is a schematic cross-sectional view of the third exemplary inductor and the sixth exemplary shielding structure taken along a section line 9B-9B of FIG. 9A.

In some embodiments, an integrated circuit 900 can include a shielding structure 910 that is disposed between the inductor 302 and the substrate 301 as shown in FIGS. 9A-9B. In some embodiments, the shielding structure 910 can include a plurality of metallic wires, e.g., metallic wires 910a-910c. The metallic wires 910a-910c can be disposed in a parallel fashion between the substrate 301 and the conductive line 370. The metallic wires 910a-910c can be routed in a direction that is substantially perpendicular to the routing direction of the conductive line 370.

In some embodiments, the metallic wires 910a-910c can be disposed between the dielectric layers 303 and 903. The dielectric layer 903 can include at least one material, such as silicon oxide, silicon nitride, silicon oxynitride, low dielectric constant (low-k) dielectric material, ultra-low-k dielectric material, another dielectric material, or any combinations thereof. In other embodiments, the metallic wires 910a-910c can be electrically coupled to each other. During the operation of the integrated circuit 900, the metallic wires 910a-910c can be grounded, floating, or electrically coupled with a common voltage.

Figure 10A:
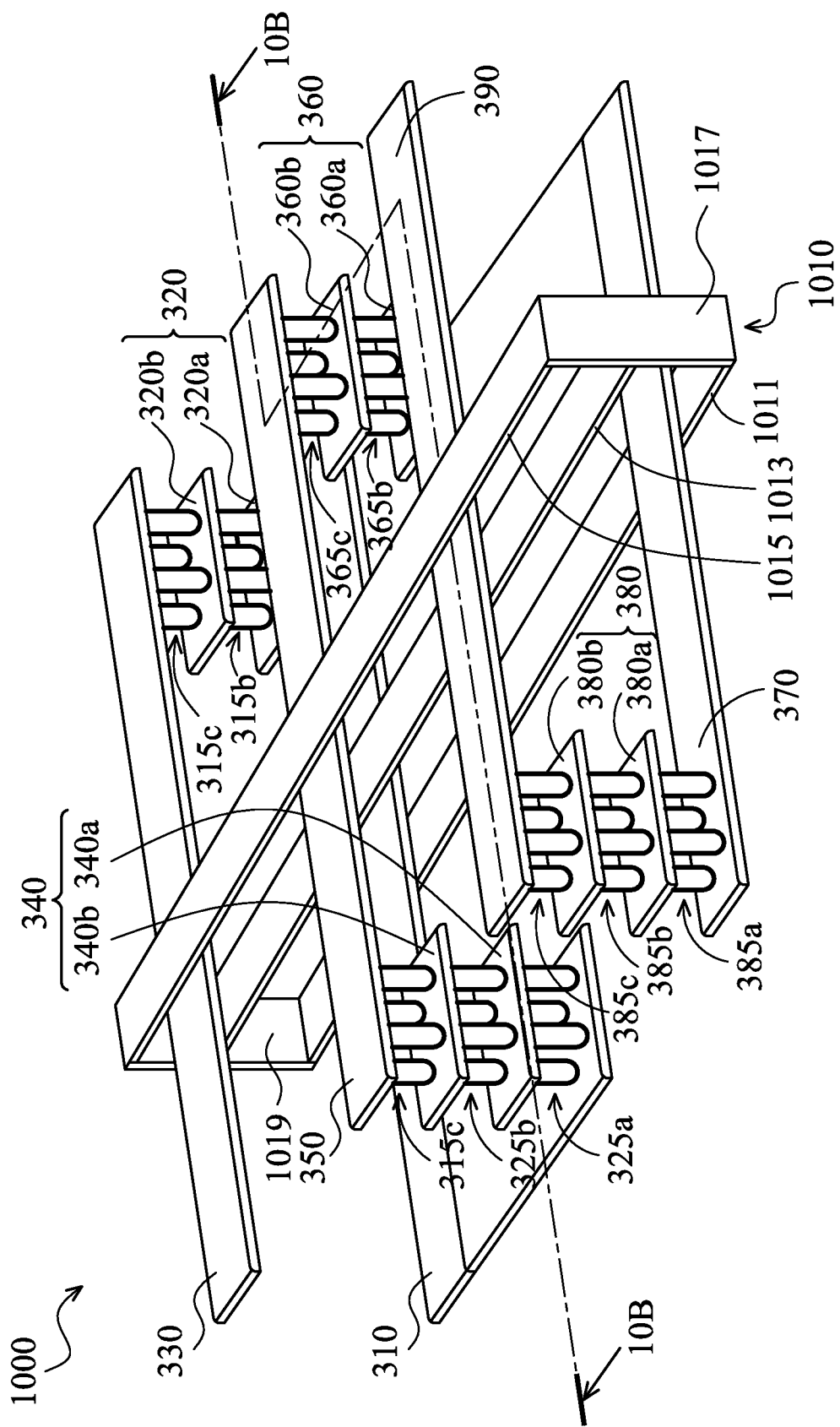
FIG. 10A is a schematic drawing illustrating a 3-D structure of the third exemplary inductor and an seventh exemplary shielding structure.
Figure 10B:
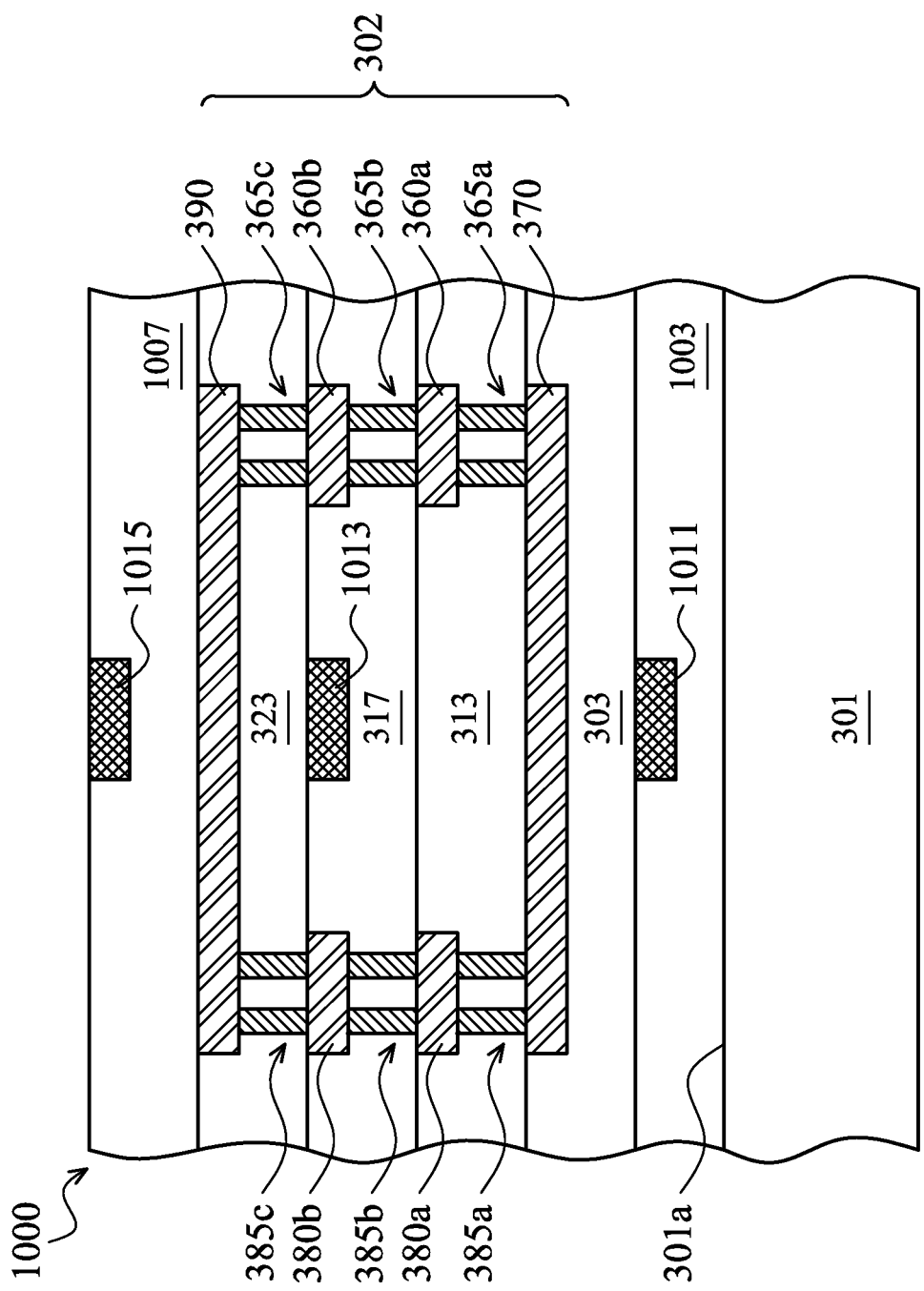
FIG. 10B is a schematic cross-sectional view of the third exemplary inductor and the seventh exemplary shielding structure taken along a section line 10B-10B of FIG. 10A.

FIG. 10A is a schematic drawing illustrating a 3-dimensional (3-D) structure of an exemplary inductor and an exemplary shielding structure. FIG. 10B is a schematic cross-sectional view of an exemplary inductor and an exemplary shielding structure taken along a section line 10B-10B. In FIGS. 10A-10B, an integrated circuit 1000 can include a shielding structure 1010. The shielding structure 1010 can include shielding portions 1011, 1013, 1015, 1017 and 1019. During the operation of the integrated circuit 1000, the shielding portions 1011, 1013, 1015, 1017 and 1019 can be grounded, floating, or electrically coupled with a common voltage.

It is noted that though merely showing a single shielding part in FIGS. 10A-10B, the scope of this application is not limited thereto. In some embodiments, the shielding structure 1010 can include two or more shielding parts. In other embodiments, the shielding parts can be electrically coupled to each other. In other embodiments, the shielding structures 1010 can include additional shielding portions (not shown) that can be disposed between the conductive lines 370 and 390.

Referring to FIG. 10B, in some embodiments the shielding portion 1011 can be disposed in a metallization layer that is below the metallization layer in which the conductive line 370 is disposed. For example, the shielding portion 1011 can be disposed between the dielectric layers 303 and 1003. In some embodiments, the dielectric layer 1003 can include at least one material, such as silicon oxide, silicon nitride, silicon oxynitride, low dielectric constant (low-k) dielectric material, ultra-low-k dielectric material, another dielectric material, or any combinations thereof.

In some embodiments, the shielding portion 1013 can be disposed between the conductive lines 370 and 390. In other embodiments the shielding portion 1013 and the conductive structure 360b can be disposed in the same metallization layer as shown in FIG. 10B. In other embodiments, the shielding portion 1013 and the conductive structure 360a can be disposed in the same metallization layer. In still other embodiments, the shielding portion 1013 can be disposed in a metallization layer that is between the metallization layers in which the conductive line 390 and the conductive structure 360b, the conductive structure 360b and the conductive structure 360a, or the conductive structure 360a and the conductive line 370 are disposed.

Referring again to FIG. 10B, in some embodiments the shielding portion 1015 can be disposed in a metallization layer that is over the metallization layer in which the conductive line 390 is disposed. For example, the shielding portion 1015 can be disposed in the metallization layer in which the dielectric layer 1007 is disposed. In some embodiments, the dielectric layer 1007 can include at least one material, such as silicon oxide, silicon nitride, silicon oxynitride, low dielectric constant (low-k) dielectric material, ultra-low-k dielectric material, another dielectric material, or any combinations thereof.

In a first exemplary embodiment, an integrated circuit includes a substrate having a surface. An inductor is disposed over the surface of the substrate. The inductor is operable to generate a magnetic field through itself that is substantially parallel with the surface.

In a secondary embodiment, an integrated circuit includes a substrate having a surface. An inductor is disposed over the surface of the substrate. The inductor includes a first conductive line disposed over the surface of the substrate. At least one first conductive structure is disposed over and electrically coupled with the first conductive line. A second conductive line is disposed over and electrically coupled with the at least one first conductive structure. At least one second conductive structure is disposed over and electrically coupled with the first conductive line. A third conductive line is disposed over and electrically coupled with the at least one second conductive structure.

One aspect of this description relates to an integrated circuit including a substrate having a surface and an inductor disposed over the surface of the substrate. The inductor configured to generate a magnetic field substantially parallel to the surface. The inductor includes a first conductive line disposed over the surface. The inductor further includes a plurality of first conductive structures disposed over and electrically coupled with the first conductive line, each of the plurality of first conductive structures having a first cross-sectional shape and a plurality of second conductive structures disposed over and electrically coupled with a respective one of the plurality of first conductive structures, each of the plurality of second conductive structures having a second cross-sectional shape different from the first cross-sectional shape. The inductor further includes a second conductive line disposed over and electrically coupled with the plurality of second conductive structures. The inductor further includes a plurality of third conductive structures disposed over and electrically coupled with the first conductive line, each of the plurality of third conductive structures having a third cross-sectional shape and at least one fourth conductive structure disposed over and electrically coupled with a respective one of the plurality of third conductive structures, each of the at least one fourth conductive structures having a fourth cross-sectional shape different from the third cross-sectional shape. The inductor further includes a third conductive line disposed over and electrically coupled with the at least one fourth conductive structure, the third conductive line extending substantially parallel to the second conductive line.

Another aspect of this description relates to an integrated circuit including a substrate having a surface and an inductor disposed over the surface of the substrate. The inductor configured to generate a magnetic field substantially parallel to the surface. The inductor includes a first L-shaped conductive line disposed over the surface, the first L-shaped conductive line having a first end and a second end and a second L-shaped conductive line disposed over the surface, the second L-shaped conductive line having a first end and a second end. The inductor further includes a first conductive structure disposed over and electrically coupled with the first end of the first L-shaped conductive line and a second conductive structure disposed over and electrically coupled with the first end of the second L-shaped conductive line. The inductor further includes a third conductive line disposed over and electrically coupled with the first conductive structure and the second conductive structure.

Still another aspect of this description relates to an integrated circuit including a substrate having a surface and an inductor disposed over the surface of the substrate. The inductor configured to generate a magnetic field substantially parallel to the surface. The inductor includes a first L-shaped conductive line disposed over the surface, the first L-shaped conductive line having a first leg extending along a first axis and a second leg extending along a second axis perpendicular to the first axis from an intersection of the first leg and the second leg. The inductor further includes a second L-shaped conductive line disposed over the surface, the second L-shaped conductive line having a third leg extending along the first axis and a fourth leg extending along the second axis from an intersection of the third leg and the fourth leg, wherein a direction of the second leg is opposite to a direction of the fourth leg. The inductor further includes a first conductive structure disposed over and electrically coupled with the first L-shaped conductive line and a second conductive structure disposed over and electrically coupled with the second L-shaped conductive line. The inductor further includes a third conductive line disposed over and electrically coupled with the first conductive structure and the second conductive structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit comprising:
   a substrate having a surface;
   an inductor disposed over the surface of the substrate, the inductor configured to generate a magnetic field substantially parallel to the surface, wherein the inductor comprises:
     a first conductive line disposed over the surface;
     a plurality of first conductive structures disposed over and electrically coupled with the first conductive line, each of the plurality of first conductive structures having a first cross-sectional shape;
     a plurality of second conductive structures disposed over and electrically coupled with a respective one of the plurality of first conductive structures, each of the plurality of second conductive structures having a second cross-sectional shape different from the first cross-sectional shape;
     a second conductive line disposed over and electrically coupled with the plurality of second conductive structures;
     a plurality of third conductive structures disposed over and electrically coupled with the first conductive line, each of the plurality of third conductive structures having a third cross-sectional shape;
     at least one fourth conductive structure disposed over and electrically coupled with a respective one of the plurality of third conductive structures, each of the at least one fourth conductive structures having a fourth cross-sectional shape different from the third cross-sectional shape; and
     a third conductive line disposed over and electrically coupled with the at least one fourth conductive structure, the third conductive line extending substantially parallel to the second conductive line,
     the second conductive line, the first conductive line, and the third conductive line being configured to define a coil standing vertically over the substrate; and
   a shielding element, the shielding element comprising a first plurality of substantially parallel shielding portions located between the inductor and the substrate,
   the shielding element further comprises a second plurality of substantially parallel shielding portions, a first shielding portion of the second plurality of substantially parallel shielding portions is located between the first conductive line and the second conductive line, and a second shielding portion of the second plurality of substantially parallel shielding portions is located between the second conductive line and the third conductive line.

2. The integrated circuit of claim 1, wherein the first cross-sectional shape is substantially the same as the third cross-sectional shape.

3. The integrated circuit of claim 1, wherein the second cross-sectional shape is substantially the same as the fourth cross-sectional shape.

4. The integrated circuit of claim 1, wherein a distance between the second conductive line and a top surface of the substrate is different from a distance between the third conductive line and the top surface of the substrate.

5. The integrated circuit of claim 1, wherein the first plurality of substantially parallel shielding portions is located in a metallization layer of the integrated circuit.

6. An integrated circuit comprising:
   a substrate; and
   an inductor disposed over the substrate, wherein the inductor comprises:

a first L-shaped conductive line disposed over the substrate, the first L-shaped conductive line having a first end, a second end, and a concave portion;

a second L-shaped conductive line disposed over the substrate, the second L-shaped conductive line having a first end, a second end, and a concave portion, the concave portion of the first L-shaped conductive line and the concave portion of the second L-shaped conductive line facing opposite directions;

a first conductive structure disposed over the substrate and electrically coupled with the first end of the first L-shaped conductive line;

a second conductive structure disposed over the substrate and electrically coupled with the first end of the second L-shaped conductive line; and a third conductive line disposed over the substrate and electrically coupled with the first conductive structure and the second conductive structure, the third conductive line being in a metallization layer different from that of the first L-shaped conductive line and that of the second L-shaped conductive line.

7. The integrated circuit of claim 6, wherein a distance from a top surface of the substrate to the first L-shaped conductive line is substantially equal to a distance from the top surface of the substrate to the second L-shaped conductive line.

8. The integrated circuit of claim 6, wherein the inductor further comprises:
a third conductive structure disposed over and electrically coupled with the second end of the first L-shaped conductive line; and
a fourth conductive line disposed over and electrically coupled with the third conductive structure.

9. The integrated circuit of claim 8, further comprising a shielding element, wherein the shielding element comprises a plurality of substantially parallel shielding portions, a first shielding portion of the plurality of substantially parallel shielding portions located between the first L-shaped conductive line and the third conductive line, between the third conductive line and the second L-shaped conductive line, and between the first L-shaped conductive line and the fourth conductive line.

10. The integrated circuit of claim 8, wherein the inductor further comprises:
a fourth conductive structure disposed over and electrically coupled with a second end of the second L-shaped conductive line; and
a fifth conductive line disposed over and electrically coupled with the fourth conductive structure.

11. The integrated circuit of claim 8, further comprising a shielding element, wherein the shielding element comprises a plurality of substantially parallel shielding portions, a first shielding portion of the plurality of substantially parallel shielding portions located between the first L-shaped conductive line and the third conductive line, between the third conductive line and the second L-shaped conductive line, and between the second L-shaped conductive line and the fifth conductive line.

12. The integrated circuit of claim 6, further comprising a shielding element, wherein the shielding element comprises a plurality of substantially parallel shielding portions, a first shielding portion of the plurality of substantially parallel shielding portions located between the first L-shaped conductive line and the third conductive line, and between the third conductive line and the second L-shaped conductive line.

13. The integrated circuit of claim 6, further comprising a shielding element disposed between the inductor and the substrate.

14. An integrated circuit comprising:
a substrate having a surface; and
an inductor disposed over the surface of the substrate, the inductor configured to generate a magnetic field substantially parallel to the surface, wherein the inductor comprises:
a first L-shaped conductive line disposed over the surface, the first L-shaped conductive line having a first leg extending along a first axis and a second leg extending along a second axis perpendicular to the first axis from an intersection of the first leg and the second leg;
a second L-shaped conductive line disposed over the surface, the second L-shaped conductive line having a third leg extending along the first axis and a fourth leg extending along the second axis from an intersection of the third leg and the fourth leg, wherein a direction of the second leg is opposite to a direction of the fourth leg;
a first conductive structure disposed over and electrically coupled with the first L-shaped conductive line;
a second conductive structure disposed over and electrically coupled with the second L-shaped conductive line; and
a third conductive line disposed over and electrically coupled with the first conductive structure and the second conductive structure.

15. The integrated circuit of claim 14, wherein the first conductive structure is disposed over and electrically coupled with the second leg, and the second conductive structure is disposed over and electrically coupled with the fourth leg.

16. The integrated circuit of claim 14, further comprising a shielding element, wherein the shielding element comprises a plurality of substantially parallel shielding portions, a first shielding portion of the plurality of substantially parallel shielding portions located between the first L-shaped conductive line and the third conductive line, and between the third conductive line and the second L-shaped conductive line.

* * * * *